United States Patent
Deng et al.

(10) Patent No.: US 11,183,364 B1
(45) Date of Patent: Nov. 23, 2021

(54) DUAL BEAM MICROSCOPE SYSTEM FOR IMAGING DURING SAMPLE PROCESSING

(71) Applicant: FEI Company, Hillsboro, OR (US)

(72) Inventors: Yuchen Deng, Eindhoven (NL); Petrus Hubertus Franciscus Trompenaars, Eindhoven (NL); Bart Buijsse, Eindhoven (NL); Alexander Henstra, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/900,749

(22) Filed: Jun. 12, 2020

(51) Int. Cl.
  *H01J 37/30* (2006.01)
  *H01J 37/21* (2006.01)
  *H01J 37/28* (2006.01)

(52) U.S. Cl.
  CPC .......... *H01J 37/3005* (2013.01); *H01J 37/21* (2013.01); *H01J 37/28* (2013.01)

(58) Field of Classification Search
  CPC ........ H01J 37/00; H01J 37/02; H01J 37/3005; H01J 37/21; H01J 37/28; H01J 37/30; H01J 37/3174
  USPC ...... 250/306, 307, 311, 492.1, 492.2, 492.21
  See application file for complete search history.

(56) References Cited

U.S. PATENT DOCUMENTS

| | | | |
|---|---|---|---|
| 2004/0129898 A1* | 7/2004 | Sohda | B82Y 10/00 250/492.22 |
| 2015/0060668 A1* | 3/2015 | Man | H01J 37/317 250/310 |
| 2015/0069235 A1* | 3/2015 | Kemen | H01J 37/10 250/311 |

* cited by examiner

*Primary Examiner* — Jason L McCormack

(57) ABSTRACT

Methods for using a dual beam microscope system to simultaneously process a sample and image the processed portions of the sample, according to the present disclosure include the initial steps of emitting a plurality of electrons toward the sample, splitting the plurality of electrons into two electron beams, and then modifying the focal properties of at least one of the electron beams such that the two electron beams have different focal planes. Once the two beams have different focal planes, the first electron beam is focused such that it acts as a STEM beam. The STEM beam is then used to process a region of the sample to induce a physical change (e.g., perform milling, deposition, charge adjustment, phase change, etc.). The second electron beam is focused to act as a TEM beam to perform imaging of the region of the sample being processed.

19 Claims, 14 Drawing Sheets

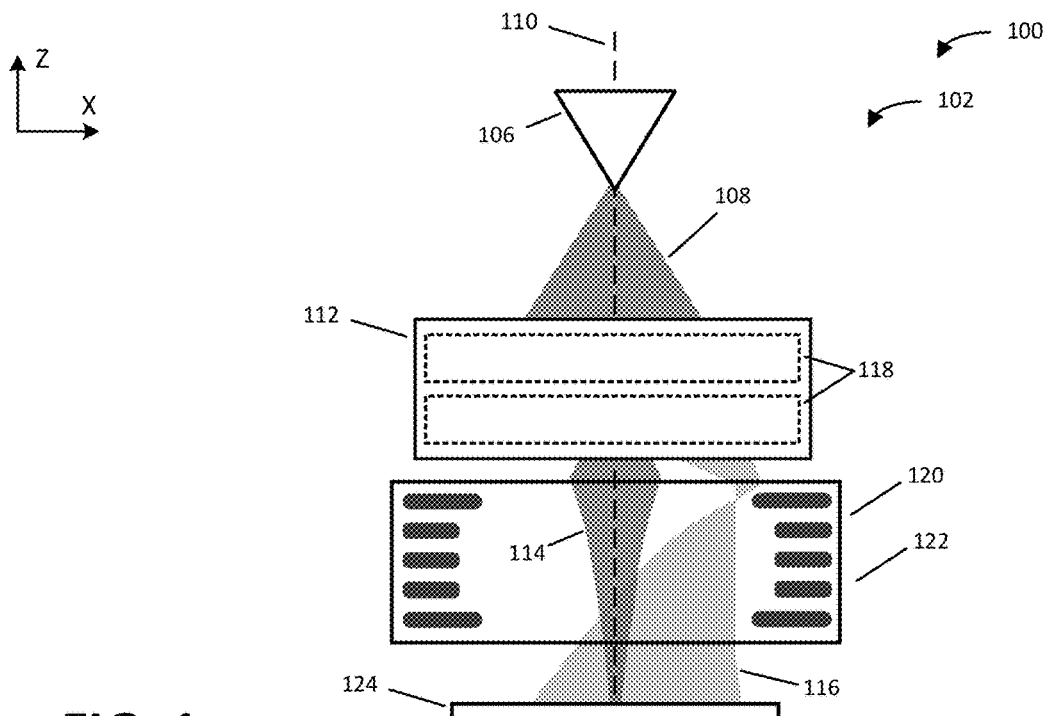
FIG. 1
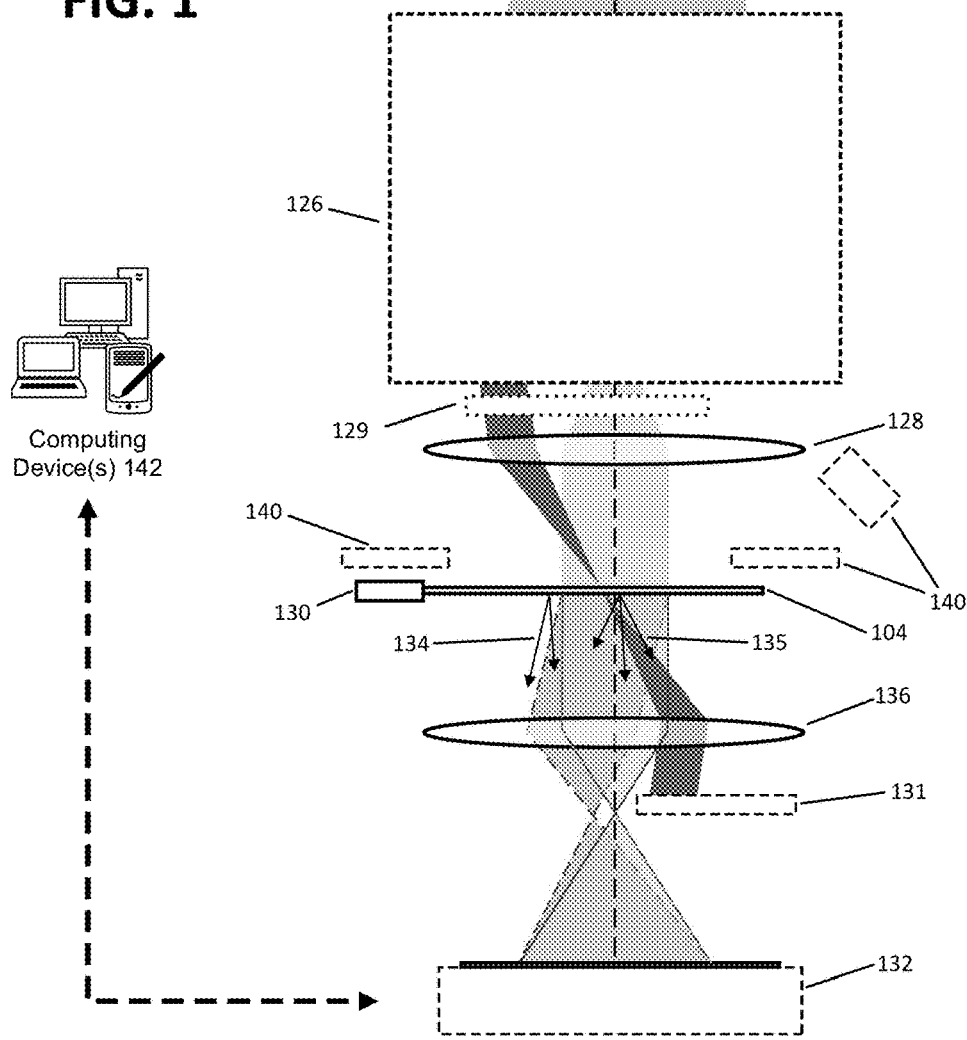

DUAL BEAM MICROSCOPE SYSTEM FOR IMAGING DURING SAMPLE PROCESSING

BACKGROUND OF THE INVENTION

Charged particle microscopes are used to perform many sample processing applications, including circuit editing, and materials analysis. However, with current charged particle microscope systems it is impossible to do real-time imaging during the sample processing. This inability to monitor the region of the sample being processed means that incidental growth/etching or processing errors are not able to be diagnosed and/or corrected until after the processing has been concluded. For example, depending on the sample composition and the atmosphere of the vacuum chamber, there may be incidental deposition, etching, and/or oxidation during sample processing, which the user is not aware of until the sample processing has stopped.

This inability to monitor the sample as it is processed fundamentally limits the usefulness of charged particle microscopes for sample processing, as current users need to either accept inexact performance, or drastically reduce throughput time by regularly halting sample processing to conduct imaging. Thus, a system that can simultaneously process and image a region of a sample is desired.

SUMMARY OF THE INVENTION

Methods for using a dual beam microscope system to simultaneously process a sample and image the processed portions of the sample, according to the present disclosure include the initial steps of emitting a plurality of electrons toward the sample, splitting the plurality of electrons into a first electron beam and a second electron beam, and then modifying the focal properties of at least one of the first electron beam and the second electron beam such that the two electron beams have different focal planes. Once the two beams have different focal planes, methods according to the present invention include the additional steps of focusing the first electron beam such that it acts as a STEM beam that is focused at the sample. The STEM beam is then used to process a region of the sample to induce a physical change (e.g., perform milling, deposition, etching, contamination growth, charge adjustment, radiation damage, sample deformation, heating, phase change, etc.).

The methods further include focusing the second electron beam so that it acts as a TEM beam, which is used to perform imaging of the region of the sample being processed so that a user can view the physical changes to the sample in or near real time. In some embodiments, the relative angles that the STEM and TEM beam is incident on the sample are such that the STEM beam and/or sample emissions resultant from the STEM beam are blocked by a beam blocker such that detectors at least primarily detect the TEM beam and/or sample emissions resultant from the TEM beam. The methods may include using a beam deflector to deflect the STEM beam such that it is no longer detected (e.g., such that it is blocked by a beam blocker, or moves outside the field of view of a detector system). In this way, when the STEM beam is deflected the TEM beam and/or sample emissions resultant from the TEM beam can be used to generate an image without interference from the STEM beam and/or sample emissions resultant from the STEM beam.

Alternatively or in addition, image processing techniques can be used to differentiate the STEM beam and/or sample emissions resultant and from the STEM beam from the TEM beam and/or sample emissions resultant from the TEM beam. In this way, the image processing techniques are able to isolate the TEM beam and/or sample emissions resultant from the TEM beam so that a TEM image of the processed region of the sample can be formed.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

FIG. 1 illustrates example dual beam systems for simultaneously processing a sample while imaging the processed portions of the sample, according to the present invention.

Figure 2:
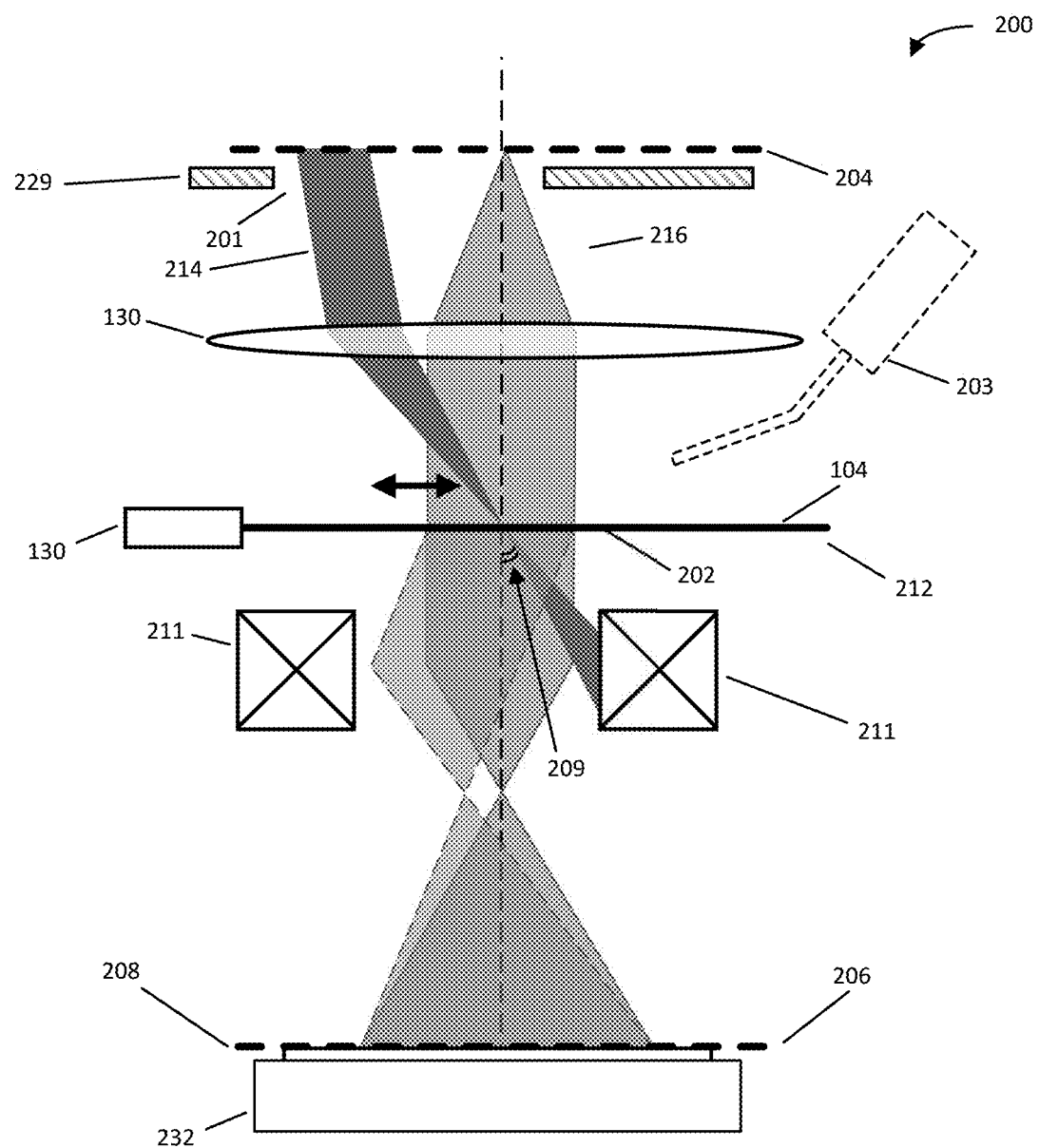
FIG. 2 illustrates an example embodiment of the imaging beam and the processing beam simultaneously interacting with the sample during investigation thereof by a dual beam system.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for using a dual beam microscope system to simultaneously process a sample and image the processed portions of the sample, are included herein. More specifically, the methods and systems disclosed herein include and/or are configured to allow a charged particle microscope to perform both TEM imaging of the sample with a first beam while using a second beam to induce physical changes on the sample. In the methods and systems, a plurality of electrons that have been emitted by an electron source are split into a first and second electron beam, and the focal properties of at least one of the first electron beam and the second electron beam are modified such that corresponding focal planes of the first electron beam and the second electron beam are different. The two beams can then be focused and/or directed such that the first electron beam (e.g., an imaging beam) is incident on the sample while the second electron beam (e.g., a processing beam) induces a desired physical change to the surface of the sample. Example physical changes can include, but are not limited to milling, deposition, etching, contamination growth, charge adjustment, radiation damage, sample deformation, heating, phase change, etc. This allows the processing of the sample to be monitored and adjusted to correct for errors, incidental growth, incidental milling, incidental deposition, etc.

In various embodiments, the microscope system may include at least one beam blocker that allows one of the two beams, both of the two beams, or neither of the two beams to be blocked. For example, a beam blocker may be positioned below the sample that blocks a STEM beam. Alternatively, or in addition, a beam blocker may also be positioned above the sample so that it selectively blocks one or both of the two beams. The beam blocker(s) may be stationary or may be capable of shifting position so as to temporarily block a desired beam, or a combination thereof. In some embodiments, the beam blocker may be used to prevent the imaging beam and/or emissions resultant from the imaging beam being incident on the sample from reaching a detector. For example, the imaging beam may be incident on the sample at a tilt angle such that imaging beam and/or emissions resultant from the imaging beam being incident on the sample are prevented from reaching a detector by a beam blocker or an aperture of the objective lens located downstream of the sample. Moreover, in some embodiments a beam blocker may be positioned such that, when a beam is deflected, the beam blocker blocks the deflected beam.

FIG. 1 is an illustration of bifocal multibeam system(s) 100 that is set up simultaneously process a sample while also imaging the processed portion of the sample, according to the present invention. Specifically, FIG. 1 illustrates an example bifocal multibeam system(s) 102 for simultaneously processing and imaging sample 104. The example bifocal multibeam system(s) 102 may include electron microscope (EM) setups or electron lithography setups that are configured to irradiate and/or otherwise impinge the sample 104 with an imaging beam (e.g., a TEM beam) and a processing beam (e.g., a STEM beam). In various embodiments, the bifocal multibeam system(s) 102 may be or include one or more different types of EM and/or charged particle microscopes, such as but not limited to, a scanning electron microscope (SEM), a scanning transmission electron microscope (STEM), a transmission electron microscope (TEM), a charged particle microscope (CPM), dual beam microscopy system, etc. Additionally, in some embodiments, a bifocal multibeam system(s) 102 may be a TEM which is capable of operating as a STEM as well.

The example bifocal multibeam system(s) 102 includes an electron source 106 (e.g., a thermal electron source, Schottky-emission source, field emission source, etc.) that emits a plurality of electrons 108 (i.e., an electron beam) along an emission axis 110 and towards a bifocal beamformer 112. The emission axis 110 is a central axis that runs along the length of the example bifocal multibeam system(s) 102 from the electron source 106 and through the sample 104.

The bifocal beamformer 112 is one or more structures configured to (i) split the plurality of electrons 108 into at least a first electron beam 114 and a second electron beam 116, and (ii) modify the focal properties of at least one of the first electron beam 114 and a second electron beam 116 such that one of the two beams becomes an imaging beam (i.e., a beam that is focused and directed to generate an image of a region of the sample 104) and the other becomes a processing beam (i.e., a beam focused and directed to induce a physical change to the sample 104). In FIG. 1, the imaging beam is shown as being a TEM beam and the processing beam is shown as being a STEM beam. For example, the bifocal beamformer 112 may modify the focal properties such that the first electron beam 114 and the second electron beam 116 have different corresponding focal planes. FIG. 1 illustrates the bifocal beamformer 112 as splitting the plurality of electrons 108 into a first electron beam 114 that runs along the emission axis 110 and a second electron beam 116. Because each of the first electron beam 114 and the second electron beam 116 are formed from the plurality of electrons 108, the first electron beam 114 and a second electron beam 116 are mutually coherent.

FIG. 1 also shows the bifocal beamformer 112 as applying a distortion to the second electron beam 116 that causes the focal properties of the second electron beam to differ from the focal properties of the first electron beam 114. Specifically, FIG. 1 illustrates the bifocal beamformer 112 as being configured to generate at least a quadrupole field (i.e. dipole field, quadrupole field, hexapole field, octupole field, etc.) that applies a quadrupole lensing effect that affects the second electron beam 116 such that the two beams have a different focal properties. The quadrupole lensing effect may distort, stigmatize, or otherwise modify at least one of the beams such that the corresponding focal properties of the beams are made different. In some embodiments, the quadrupole lensing effect may apply a different lensing effects in one meridional plane (e.g. an x-z plane) than in a perpendicular meridional plane (e.g., a y-z plane), causing a different change to each of the focal properties in each of the two meridional planes. Such a stigmatization is illustrated in the example system shown in FIG. 6.

In such embodiments, a multipole element (e.g., a stigmator) downstream of the bifocal beamformer may apply a complimentary quadrupole lensing effect to the one of the second electron beam 116 to correct for aberrations caused by the bifocal beamformer 112, and cause the second electron beam 116 to become a cylindrically symmetric beam again. In this way, the multipole element causes the second electron beam 116 to be cylindrically symmetric downstream of such a multipole element while also having different focal planes from the first electron beam 114. In various setups this multipole element may be placed in a focal plane of the first electron beam 114 so that the complementary quadrupole lensing effect is not applied to the first electron beam 114.

In some embodiments, the bifocal beamformer 112 is configured to modify the focal properties of at least one of the first electron beam 114 and the second electron beam 116 such that the second electron beam 116 is a STEM beam (i.e., has a focal plane at a specimen plane at or near the sample 104) and the first electron beam 114 is a TEM beam (i.e., has a corresponding focal plane such that the first electron beam 114 is parallel, substantially parallel, or slightly convergent at the specimen plane at or near the sample 104). In various embodiments, the bifocal beamformer 112 may modify the focal plane of the first electron beam 114 such that it is focused at a plane which is located at least 0.1%, 1%, 10%, or 100% of the objective lens focal distance above the upper objective lens 128. Alternatively or in addition, the bifocal beamformer 112 may be configured to modify the focal properties of at least one of the first electron beam 114 and the second electron beam 116 such that the diameter of the first electron beam 114 at a specimen plane at or near the sample 104 is at least one of 20, 50, 100, 500, or 1000 times greater than the diameter of the second electron beam 116 at the specimen plane. In such embodiments, the bifocal beamformer 112 may cause the diameter of the first electron beam 114 to be at least one of 20, 50, 100, 500, or 1000 times greater than the diameter for the second electron beam 116 at any plane where the second electron beam 116 is in focus. In some embodiments, the bifocal beamformer 112 further causes one or both of the first electron beam 114 and the second electron beam 116 to be deflected away from the emission axis 110.

Alternatively, the bifocal beamformer 112 may modify the focal properties of at least one of the electron beams such that the first electron beam 114 is a STEM beam (i.e., has a focal plane at a specimen plane at or near the sample 104) and the second electron beam 116 is a TEM beam (i.e., has a corresponding focal plane such that the first electron beam 114 is parallel, substantially parallel, or slightly convergent at the specimen plane at or near the sample 104). In such embodiments, the focal planes(s) may be modified such that the second electron beam 116 is focused at a plane which is located at least 0.1%, 1%, 10%, or 100% of the objective lens focal distance above the sample 104.

While FIG. 1 illustrates an embodiment where the bifocal beamformer 112 is shown as modifying the focal properties of the second electron beam 116, in other embodiments the bifocal beamformer 112 may cause the focal properties of the first electron beam 114, or both beams to be changed, such that the two beams become an imaging beam and a processing beam. That is, a person having skill in the art would understand that the actions or effects described as being applied to one beam may be applied to the other beam in a different embodiment to enable the two beams to become an imaging beam and a processing beam. In various embodiments, the bifocal beamformer 112 or another component of a bifocal multibeam system 102 may apply a deflection to one or both of the beams to cause them to act as an imaging beam and a processing beam.

In some embodiments, the bifocal beamformer 112 may be composed of a single component that performs both the forming of the first electron beam 114 and the second electron beam 116 and the modification of the focal properties of at least one of the two beams. For example, the bifocal beamformer 112 may correspond to a microelectromechanical system (MEMS) that both forms the two beams and generates at least a quadrupole electromagnetic field (i.e. dipole field, quadrupole field, hexapole field, octupole field, etc.) which applies at least a quadrupole lensing effect that focuses, stigmatizes, and/or otherwise modifies at least one of the beams such that the corresponding focal properties of the beams are made different.

In another example, the bifocal beamformer 112 may correspond to an aperture array comprising a structure defining a plurality of apertures and/or cavities that both form the two beams and create at least a quadrupole electromagnetic fields that applies the quadrupole lensing effect to one or more of the two beams. In some embodiments, the quadrupole lensing effect may apply a positive lensing in one meridional plane (e.g. an x-z plane) and a negative lensing effect in a perpendicular meridional plane (e.g., a y-z plane), causing a different change to each of the focal properties in each of the two meridional planes.

In such systems, a multipole element 124 (e.g., a corrector, a stigmator or a multipole element which is part of an aberration corrector, a corrector of the quadrupole/octupole type, etc.) may be included in the example bifocal multibeam system(s) 100 further downstream to apply a complementary quadrupole lensing effect to make the beam cylindrically symmetric again. For example, FIG. 1 illustrates the bifocal multibeam system(s) 102 as including a stigmator. Alternatively or in addition, the bifocal beamformer 112 may be positioned and/or configured to cause at least one of the one or more aberrations of the electron beams to correct another aberration in the bifocal multibeam system(s) 102. Such a system component may be positioned in a focal plane of the electron beam to which bifocal beamformer 112 did not apply at least a quadrupole lensing effect. In embodiments where the bifocal beamformer applies at least a first quadrupole lensing effect to the first electron beam 114 and a second quadrupole lensing effect to the second electron beam 116, such a bifocal multibeam system(s) 100 may include a first multipole element 124 positioned in a focal plane of the first electron beam 114 and configured to apply a complementary quadrupole lensing effect to the second electron beam 116, and a second multipole element 124 positioned in a focal plane of the second electron beam 116 and configured to apply a complementary quadrupole lensing effect to the first electron beam 114.

Alternatively, the bifocal beamformer 112 may be composed of a plurality of components 118. Individual components 118 may perform one of the forming of the first electron beam 114 and the second electron beam 116 and the modification of the focal properties of at least one of the two beams, or they may contribute to one or both of the forming the beams and modifying of focal properties in concert with other components 118. In some embodiments, the individual components 118 may include a physical structure that blocks a portion of the plurality of electrons 108 while allowing others to pass through, a biprism (e.g., a charged wire), an amplitude-division electron beam splitter made of thin crystals or nanofabricated gratings, a beam splitting laser system configured to use one or more lasers pattern fringes to split the plurality of electrons 108 into the first electron beam 114 and the second electron beam 116, etc. Alternatively, or in addition, the individual components 118 may include one or more lenses (e.g., an einzel lens, a quadrupole lens, etc.) that are positioned or otherwise configured to cause the first electron beam 114 and the second electron beam 116 to have different focal planes. For example, the bifocal beamformer 112 may be composed of a physical structure defining two apertures, and a lens positioned and/or configured to adjust the focal properties of the at least one of the first electron beam and the second electron beam such that they have different corresponding focal planes. In various embodiments, such a lens may be positioned above or below the physical structure.

FIG. 1 illustrates the bifocal beamformer 112 as being positioned upstream of focusing component 120 that is configured to apply a lensing action that focuses at least one of the first electron beam 114 and the second electron beam 116. Moreover, the focusing component 120 is positioned upstream of the multipole element 124. In the example bifocal multibeam system(s) 102 shown in FIG. 1, the focusing component corresponds to an accelerator 122 that accelerates/decelerates, focuses, and/or directs the first electron beam 114 and the second electron beam 116 towards a focusing column 126. However, in other embodiments, the accelerator 122 may be positioned between electron source 106 and the bifocal beamformer 112 such that the accelerator 122 accelerates/decelerates, focuses, and/or directs the electrons 108 to the bifocal beamformer 112, and the bifocal beamformer 112 splits and modifies the focal properties of electrons 108 at a final energy (e.g., 30 kV). In such embodiments, the focusing component 120 may correspond to a lens or other structure configured to apply a lens action that focuses at least one of the first electron beam 114 and the second electron beam 116.

The focusing column 126 focuses the electron beams 114 and 116 so that they are incident on sample 104 as an imaging beam and a processing beam. Specifically, FIG. 1 illustrates the focusing column 126 focusing the second electron beam 116 so that is a STEM beam (e.g., a beam that has a focal plane at a specimen plane at or near the sample 104) and the first electron beam 114 such that it is a TEM beam (e.g., a beam that is parallel, substantially parallel, or slightly convergent/divergent at the specimen plane at or near the sample 104).

While not illustrated in FIG. 1, those having skill in the art will understand focusing column 126 may include one or more correctors (e.g., a Cs or Cs+Cc aberration corrector), transfer lenses, deflectors (to deflect the imaging beam, the processing beam, and/or both), scan coils, etc. necessary to enable and/or enhance the investigation of the sample 104 with the bifocal multibeam system(s) 102. For example, the focusing column 126 may include one or more deflectors that cause the processing beam to scan across the surface of the sample, while not deflecting the imaging beam. Alternatively, such a deflection may be caused or assisted by one or more electromagnetic fields (e.g., a dipole field) generated by the multipole element 124 and/or the bifocal beamformer 112. In some embodiments, such a dynamic tilting may be caused by an individual detector/detector system in a MEMS device bifocal beamformer 112. However, in other embodiments, the dynamic tilting may be causes and/or supplemented by one or more macroscopic deflector systems (e.g., in the condenser optics). In embodiments where the deflectors/deflection forces effects both electron beams, the bifocal multibeam system 102 may be configured to fast switch between imaging modes so that a STEM beam can be deflected while imaging results from a TEM beam remain unaffected.

FIG. 1 also shows the bifocal multibeam system(s) 102 as including an objective lens 128. The objective lens 128 is an optical element that focuses one of the first electron beam 114 and the second electron beam 116 to a point near or on the sample 104. The objective lens 128 may comprise a single-polepiece lens, a magnetic electrostatic compound lens, electrostatic detector objective lens, or another type of objective lens. For example, the objective lens 128 may correspond to a TEM objective lens in which the sample is immersed within the TEM objective lens and/or between the pre-specimen and post specimen components of the TEM objective lens 136.

FIG. 1 further shows the bifocal multibeam system(s) 102 as including a beam blanker 129 that is configured to allow one of the two beams, both of the two beams, or neither of the two beams to be blocked. The beam blanker 129 may comprise a physical structure that defines one or more apertures that allow electrons to pass through the beam blanker. For example, the beam blanker 129 may cause one of the beams to be deflected such that it is blocked by a blocking structure, such as a structure defining an aperture, a knife edge, a Faraday cup, etc. An example blocking structure may correspond to a single structure that defines a single aperture that allows both beams to pass through until the beam blanker 129 (or the bifocal beamformer 112) deflects one of the beams such that it no longer passes through the single aperture. In another embodiment, the blocking structure may define a first aperture that allows the TEM beam to pass through the blocking structure and a second aperture that allows the STEM beam to pass through the blocking structure. One of the two beams can then be deflected such that the corresponding beam no longer passes through a corresponding aperture in the blocking structure, and is thus prevented from passing through the blocking structure (i.e., is blanked). Alternatively, in some embodiments, the blocking structure itself may be translated and/or one of the apertures may be obstructed such that one of the beams is prevented from passing through the blocking structure. This allows the microscope system to switch between a TEM mode of operation, a STEM mode of operation, and/or a simultaneous STEM and TEM mode of operation.

In some embodiments, the bifocal multibeam system 102 may include at least one beam blocker 131 below the sample 104 that prevents the imaging beam and/or emissions resultant from the processing beam being incident on the sample from reaching a detector 132. Alternatively, the processing beam may be incident on the sample at a tilt angle such that processing beam and/or emissions resultant from the imaging beam being incident on the sample or are partially, mostly, or entirely prevented from reaching a detector 132 by the aperture of the objective lens. The beam blocker 131 may be stationary or may be able to be translated to selectively block the processing beam and/or emissions resultant therefrom. In some embodiments, the beam blocker 131 may be a needle that is positioned between the sample 104 and the detector 132 that blocks the unscattered portions of the STEM beam.

FIG. 1 further illustrates the bifocal multibeam system(s) 102 as including a sample holder 130 that holds the sample 104. As noted above, FIG. 1 shows the first electron beam 114 as being a TEM beam that is incident on the sample 104 and the second electron beam 116 as being a STEM beam. The bifocal multibeam system(s) 102 also includes a detector 132 (e.g., a camera) positioned in the diffraction plane that is configured to detect the first electron beam 114, the second electron beam 116, the diffracted electrons 134 that pass through the sample 104 as a result of the electron beams 114 being incident on the sample 104, and the diffracted electrons 135 that pass through the sample 104 as a result of the electron beam 116 being incident on the sample 104. In this way, the sample emissions and/or diffracted electrons resultant from both beams being incident on the sample are detected by a single detector 132 and/or a single detector array 132 and 140. Thus, the detector data from detector 132/detector array 140 can be to generate either a secondary electron image of the sample, a TEM image, or both. For example, in some embodiments by using the beam blanker 129 to first block the first beam 114 and then the second beam 116, the bifocal multibeam system(s) 102 can obtain a TEM image and a STEM image in immediate succession without having to switch out and/or otherwise reconfigure the detector system.

FIG. 1 further shows bifocal multibeam system(s) 102 as optionally including computing device(s) 142. In various embodiments, the computing device(s) 142 may be configured to determine or generate a TEM image and/or STEM image based on detector data from the detectors 132 and/or detector array 140. This may include the ability to separate the portions of the detector data that correspond to STEM emissions from the portion of detector data that corresponds to the TEM emissions. Additionally, the computer systems may be able to control one or more functions of the bifocal multibeam system(s) 102, including but not limited to initiation of the processes discussed herein, modifying the functionality of the bifocal multibeam system(s) 102, switching between modes, etc. Those skilled in the art will appreciate that the computing devices 142 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 142 may also be connected to other devices that are not illustrated, or instead may operate as a stand-alone system.

FIG. 2 is an illustration of the imaging beam and the processing beam simultaneously interacting with the sample during investigation thereof by the example bifocal multibeam system 100. Specifically, FIG. 2 illustrates an example embodiment where the first beam 214 is a processing beam that is focused on a plane at or near the surface of the sample 104, and the imaging beam 216 is a TEM beam that is substantially perpendicular to the sample plane at the sample 104. However, in other embodiments the first electron beam 214 may act as the imaging/TEM illumination beam, and the second electron beam 216 may be focused on the surface of the sample to induce a physical change. FIG. 2 also shows a beam blanker 229 that causes one of the beams to be deflected such that it is blocked by a blocking structure, such as a structure defining an aperture, a knife edge, a Faraday cup, etc.

defines a single aperture 201 through which the first beam 214 and the second beam 216 pass through. It should be understood that one or more deflectors, a multipole element, a bifocal beamformer, or a combination thereof may be used to generate a deflection that deflects one of the first beam 214 or the second beam 216 such that the deflected beam is blanked by the beam blanker 129.

As discussed in the remarks regarding FIG. 1, the first electron beam 214 may be scanned across the surface of a region of interest of the sample to induce a physical change to the sample. For example, the first electron beam 214 may be used to perform milling of the sample, etching of the sample (e.g., gas assisted etching), deposition on the sample (e.g., gas assisted deposition), causing radiation damage to a region of the sample, causing a phase change to the region of the sample, reducing and/or inducing a charge buildup on a region of the sample, heating the sample, deforming the sample, or a combination thereof. For example, when performing cryo electron microscopy, the first electron beam 214 may be used to reduce sample strain, and/or melt desired portions of the sample. In this way, a user may use the first beam 214 to release the high stress on the sample without damaging the area of interest, and then use the second electron beam 216 to generate the final image. In another example, the first electron beam 214 may be used to induce phase changes on regions of the sample. Such phase change patterns can be created using the first electron beam 214 to perform various functions, such as aberration correction.

In another example use case, the bifocal multibeam system 100 may include a gas injection system 203 that introduces a gas to a volume near where the first electron beam 214 is incident on the sample 104 such that the first electron beam 214 causes a buildup of a physical deposit (e.g., a mound, a ridge, a bridge, a needle structure, etc.) on the sample 104. It should be understood that one or more deflectors, a multipole element, a bifocal beamformer, or a combination thereof may be used to generate a deflection that deflects one of the first beam 214 or the second beam 216 such that the location where the deflected beam is incident (i.e., where the physical change is induced) on the sample changes.

FIG. 2 shows the first electron beam 214 as being a non-axial beam, however in other embodiments the first electron beam 214 as being an axial beam. Similarly, while FIG. 2 illustrates the second electron beam 216 as being an axial beam, in other embodiments the second electron beam 216 may be a non-axial beam. FIG. 2 further shows the second electron beam 216 as having a front focal plane 204 positioned above the objective lens 130, and a back focal plane 206 that corresponds to the imaging plane 208. In this way, the bifocal multibeam system 100 is able to perform imaging of a region of interest of the sample 104 using the second electron beam 216 while the first electron beam 214 is used to process the sample 104. This allows the processing of the sample 104 by the first electron beam 214 to be performed and/or altered (e.g., changing one or more of: the location of incidence of the first electron beam on the region of interest; the spot size of the of first electron beam on the region of interest; the current of the first electron beam, etc.) based on the imaging information. For example, where the TEM imaging shows a charge buildup on a portion of the sample 104, the first electron beam 214 can be deflected so as to reduce the charge buildup. Since the second electron beam 216 is able to image the processing of the sample to be monitored in real time, the bifocal multibeam system 100 allows the characteristics of the first electron beam 214 to be changed in real time. Such dynamic control may enable the bifocal multibeam system 100 to reliably induce complex physical changes to the sample 104.

In some embodiments, the tilt angle 209 of the first electron beam 214 on the sample may be such that the first electron beam 214 and/or electrons emitted by the sample 104 due to the first electron beam being incident on the sample 104 are not detected by detector 232. For example, FIG. 2 shows an aperture of the lower portion of the objective lens 211 not allowing the first electron beam 214 and/or electrons emitted by the sample 104 due to the first electron beam being incident on the sample 104 to be detected by detector 232. In other embodiments, a different blocking structure positioned below the sample 104 may partially, mostly, or completely block the first electron beam 214 and/or electrons emitted by the sample 104 due to the first electron beam being incident on the sample 104.

In alternative embodiments, the tilt angle 209 of the first electron beam may be such that the first electron beam 214 is blocked by optional beam blocker positioned below the sample 104. In this way, the processing of the sample 104 with the electron beam 214 does not interfere (or minimally interferes) with the TEM imaging of the sample 104 with the second electron beam 216. This allows the imaging and processing of the sample to be performed simultaneously.

Figure 3:
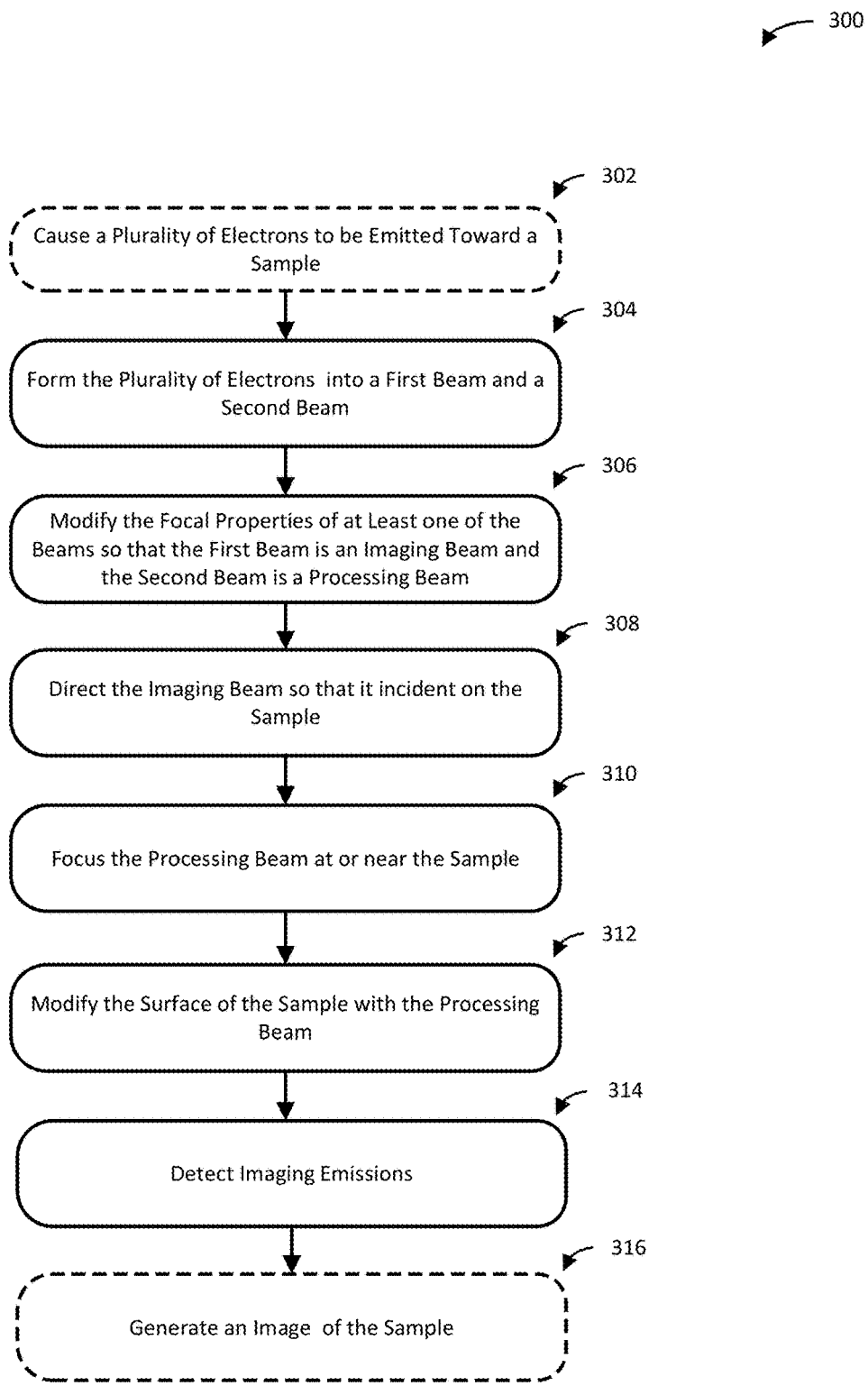
FIG. 3 is a sample process for simultaneously processing and imaging a sample according to the present invention.

FIG. 3 is a flow diagram of illustrative processes illustrated as a collection of blocks in a logical flow graph, which represent a sequence of operations that can be implemented in hardware, software, human operation, or a combination thereof. In the context of software, the blocks represent computer-executable instructions stored on one or more computer-readable storage media that, when executed by one or more processors, cause the performance of the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

FIG. 3 is a depiction of a sample process 300 for simultaneously processing and imaging a sample according to the present invention. The process 300 may be implemented in any of the example microscope system(s) 100, 700, 1200, and 2600.

At 302, a plurality of electrons are emitted towards a sample by an electron source. The electron source may include a thermal electron source, Schottky-emission source, field emission source, etc. The electron source emits the plurality of electrons along an emission axis.

At 304, the plurality of electrons are formed into a first electron beam and a second electron beam. According to the present invention, the plurality of electrons are formed into the two beams by a bifocal beamformer or a component thereof. In some embodiments, a component of the bifocal beamformer defines at least a first aperture that is configured to allow a first portion of the electrons to pass through the bifocal beamformer (i.e., the first electron beam) and a second aperture configured to allow a second portion of the electrons to pass through the bifocal beamformer (i.e., the second electron beam). Alternatively, or in addition, the bifocal beamformer may include a biprism, an amplitude-division electron beam splitter made of thin crystals or nanofabricated gratings, a beam splitting laser system, or another type of mechanism known to those skilled in the art for splitting electron beams.

At 306, the focal properties of at least one of the first electron beam and the second electron beam is modified so that the first electron beam is an imaging beam and the second electron beam is a processing beam. Specifically, according to the present invention the bifocal beamformer or a component thereof is further configured to modify the focal properties of at least one of the first electron beam and a second electron beam such that the two beams have different corresponding focal planes. That is, the first electron beam is modified such that it is parallel, substantially parallel, or slightly convergent/divergent at the specimen plane at or near the sample, and the second electron beam is modified such that it has a focal plane at a specimen plane at or near the sample. In some embodiments, the focal properties and/or focal planes of both beams is adjusted. However, in other embodiments, the focal properties and/or focal planes of just one of the two beams is adjusted.

At 308, the imaging beam is directed so that it is incident on the sample. For example, the imaging beam may be a TEM beam that is focused such that it is a parallel beam (or in the case of converge TEM imaging techniques, a slightly converged/diverged beam) when it is incident on the sample. The TEM beam is held in a constant position and orientation on the sample the during imaging process. Alternatively, where the imaging beam is a STEM beam it may be caused to scan the surface of a region of interest of the sample.

At 310, the processing beam is focused on a second plane that is at or near the sample. During the processing, the processing beam may be systematically deflected such that the location on the surface of the sample on which the processing beam is incident changes. That is, the processing beam may be systematically deflected such that it scans across a region of the surface of the sample that is being investigated. Additionally, in some embodiments the imaging beam may also be deflected. In various embodiments, deflections may be performed by the system's bifocal beamformer (e.g., a MEMS device), with a macroscopic deflector downstream of the bifocal beamformer, etc.

At 312, the surface of the sample is modified with the processing beam. For example, the processing beam may be used to perform milling of the sample, etching of the sample (e.g., gas assisted etching), deposition on the sample (e.g., gas assisted deposition), causing radiation damage to a region of the sample, causing a phase change to the region of the sample, reducing and/or inducing a charge buildup on a region of the sample, heating the sample, deforming the sample, or a combination thereof.

At 314, electrons and/or emissions resultant from the imaging beam interacting with the sample are detected. For example, one or more detectors positioned in the imaging plane may detect portions of the electron beams that are transmitted through the sample, electrons diffracted by the sample, emissions from the sample, or a combination thereof. This detection may occur while the processing beam is modifying the surface of the sample.

At 316, an image of the sample is generated using the detected emissions/electrons. Where the emissions from both imaging beam and the processing beam are detected, generating the images may first involve separating the portion of the detected emissions/electrons into a first portion that is associated with the imaging beam and a second portion that is associated with the processing beam. Alternatively, the processing beam and/or emissions resultant from the processing beam may be blocked so that only emissions due to the imaging beam are detected. Because the image is generated while the surface of the sample is being modified by the processing beam, a user can use the images to monitor the processing, control the processing, and/or change the characteristics of the processing beam in real time.

Figure 4:
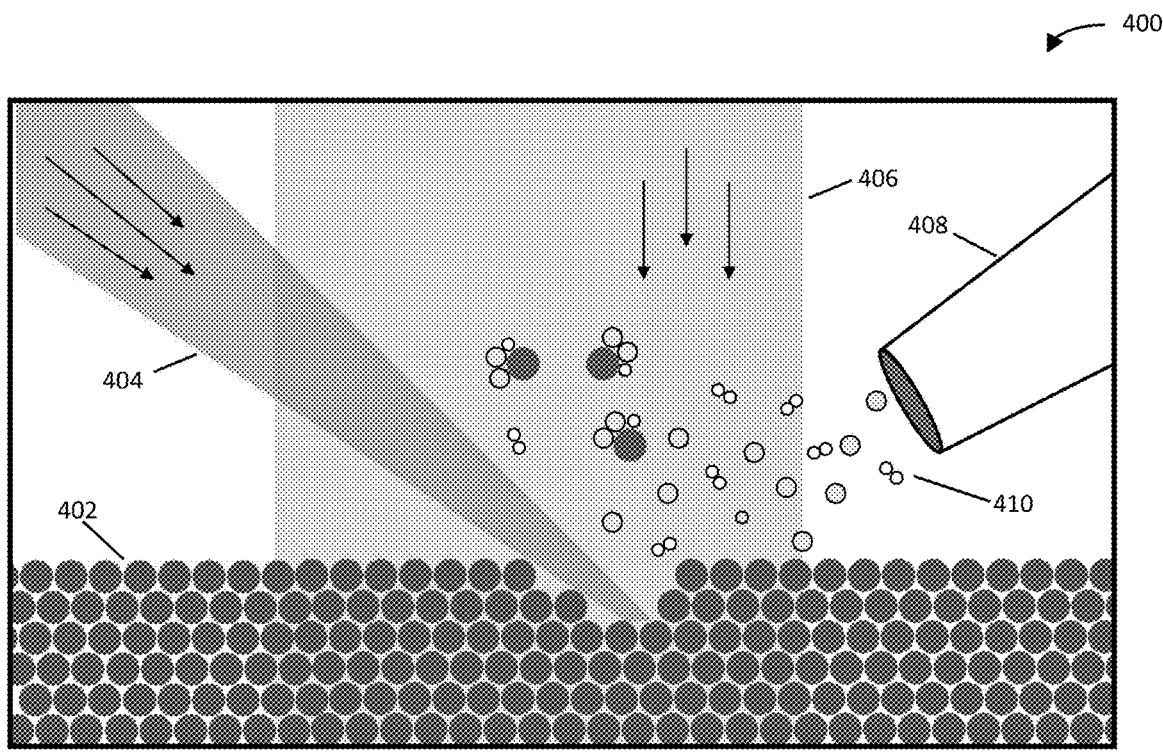
FIG. 4 is diagram of a sample being etched with a processing beam while simultaneously being imaged with an imaging beam according to the present invention.
Figure 5:
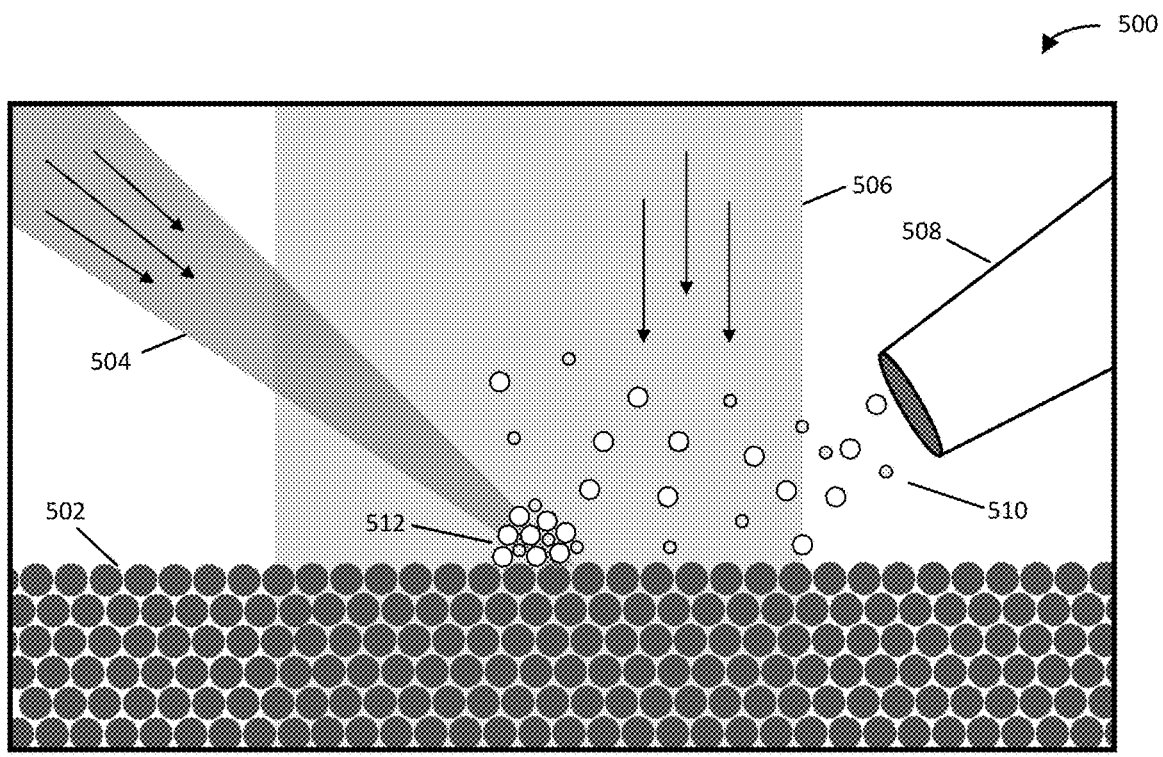
FIG. 5 is a diagram of a processing beam being used to perform gas assisted deposition on the sample while an imaging beam is simultaneously used to image the sample.

FIGS. 4 and 5 are instructive diagrams of the bifocal multibeam system(s) 100 ability to simultaneously image and process a sample according to the present invention. FIG. 4 shows an instructive diagram of a sample 402 being etched with a processing beam 404 while simultaneously being imaged with an imaging beam 406. FIG. 4 shows a gas injection system 408 that introduces a gas 410 to a volume near where the processing beam 404 is incident on the sample 402 such that the processing beam 404 causes portions of the sample 402 to be removed.

FIG. 5 shows an instructive diagram of a 504 processing beam being used to perform gas assisted deposition on a sample 502 while an imaging beam 506 is simultaneously used to image the sample 502. FIG. 5 shows a gas injection system 508 that introduces a gas 510 to a volume near where the processing beam 504 is incident on the sample 502 such that the processing beam 504 causes a buildup of a physical deposit 512 (e.g., a mound, a ridge, a bridge, a needle structure, etc.) on the sample 502.

Figure 6:
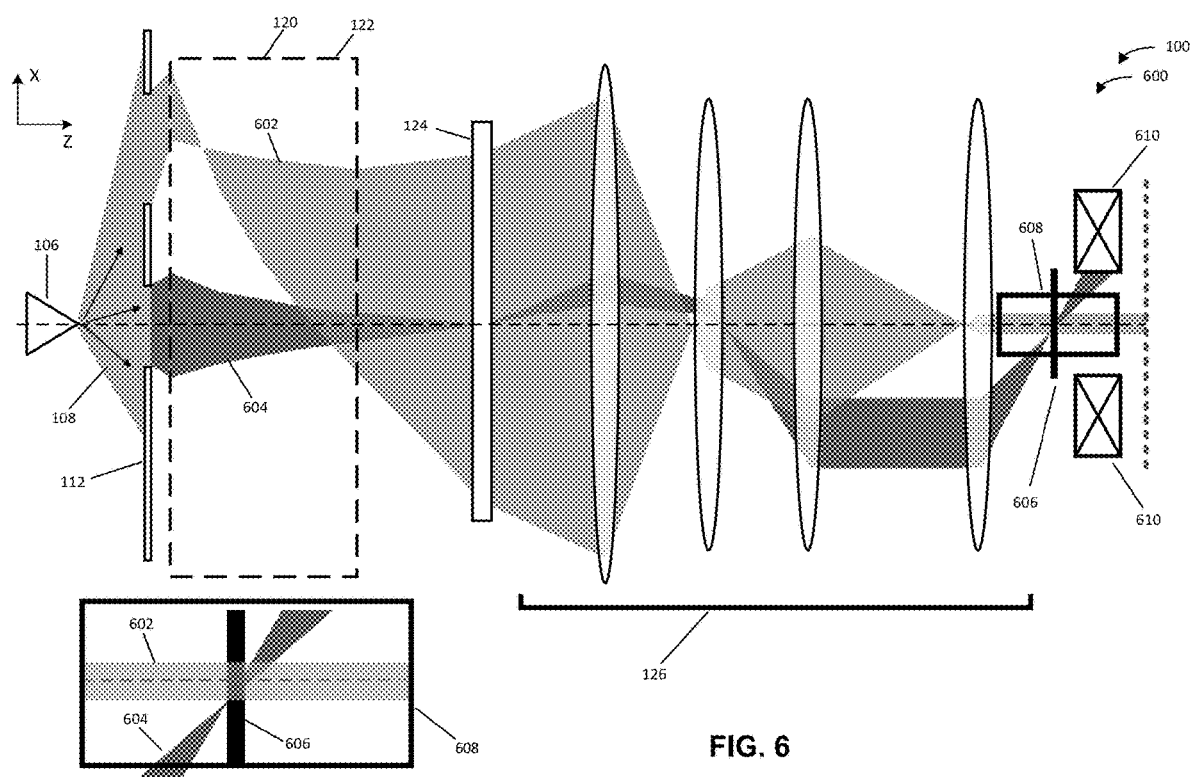
FIG. 6 illustrates the optical performance of the bifocal multibeam system according to the present invention.

FIG. 6 is an illustration of the optical performance of the bifocal multibeam system 100 according to the present invention. Specifically, FIG. 6 shows example beam paths of bifocal multibeam charged particle system 600 where at least a quadrupole lensing effect is applied to a non-axial imaging beam 602 and an axial processing beam 604.

FIG. 6 depicts an electron source 106 emitting a plurality of electrons 108 toward a bifocal beamformer 112. The bifocal beamformer 112 is illustrated as both splitting the plurality of electron 108 into a non-axial imaging beam 602 and an processing beam 604. FIG. 6 further illustrates the bifocal beamformer 112 as applying at least a quadrupole lensing effect to the non-axial imaging 602, which changes the focal properties of the non-axial imaging beam 602.

In some embodiments, a result of the quadrupole lensing effect is that the non-axial imaging beam 602 is no longer a cylindrically symmetric beam. A multipole element 124 (e.g., a multipole, a stigmator, etc.) for correcting one or more astigmatisms and/or causing the non-cylindrically symmetric non-axial imaging beam 602 to be cylindrically symmetric is shown in FIG. 6 as being positioned at a focal plane of the axial imaging beam 602. For example, the multipole element 124 may apply at least a quadrupole lensing effect to the non-axial imaging beam 602 such that it becomes cylindrically symmetric downstream of the multipole element 124. Because the corrector is positioned in a plane where the axial processing beam 604 is focused to a point, the effect of the corrector on the beam is minimized. Moreover, FIG. 6 shows an embodiment where the multipole element 124 is further configured to apply an electromagnetic field that applies a deflection to the beams perpendicular to the emission axis (e.g., a dipole field). In FIG. 6, this deflection causes the non-axial imaging beam 602 to become an axial beam downstream of the multipole element 124 and causes the axial processing beam 604 to become a non-axial beam downstream of the multipole element 124.

The focusing column 126 is shown as including a plurality of transverse lenses. The focusing column 126 is shown as focusing the non-axial imaging beam 602 such that the TE imaging beam 602 is a substantially parallel (or in the case of non-parallel TEM imaging a slightly converging or diverging beam) when the imaging beam 602 is incident on the specimen 506. FIG. 6 further shows the focusing column 126 focusing the processing beam 604 so that it has a focal plane at or near the specimen plane. To illustrate this, FIG. 6 depicts an inset 608 that shows a focal plane of the processing beam 604 as coinciding with the specimen 606 focal plane.

In the depicted embodiment, one of the multibeam element 124 and the bifocal beamforming mechanism 112 of the bifocal multibeam system 600 is further configured to apply a dynamic deflection to the processing beam 604 to cause the processing beam 604 to scan the surface of the specimen 606 to induce a physical change to the specimen 606 (e.g., perform milling, deposition, etching, contamination growth, charge adjustment, radiation damage, sample deformation, heating, phase change, etc.). Because this dynamic deflection does not affect the imaging 602, a detector or detector array can simultaneously obtain detector data for imaging the sample while the sample is being processed by the processing beam 604.

Additionally, FIG. 6 illustrates the focusing column 126 as causing the processing beam 604 to have a relative angle with the sample 606 such that it is blocked by a lower portion of the objective lens 610. In other embodiments the processing beam 604 to have a relative angle with the sample 606 such that it is blocked by another type of beam blocker positioned below the sample.

Figure 7:
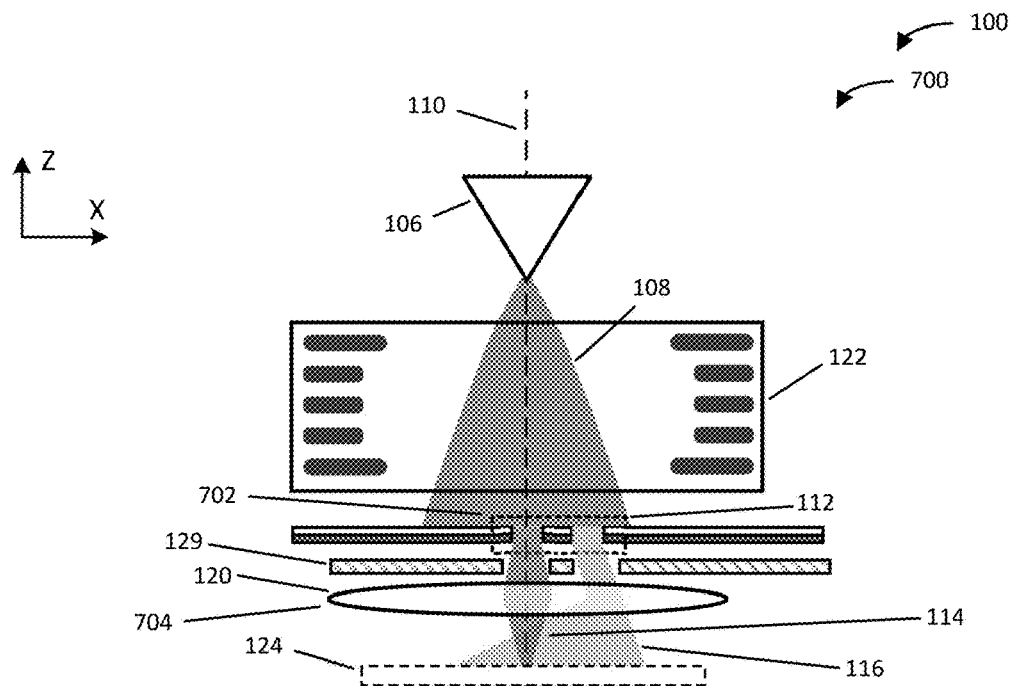
FIG. 7 illustrates example bifocal multibeam systems for investigating a sample where the bifocal beamformer comprises a MEMS device.
Figure 7:
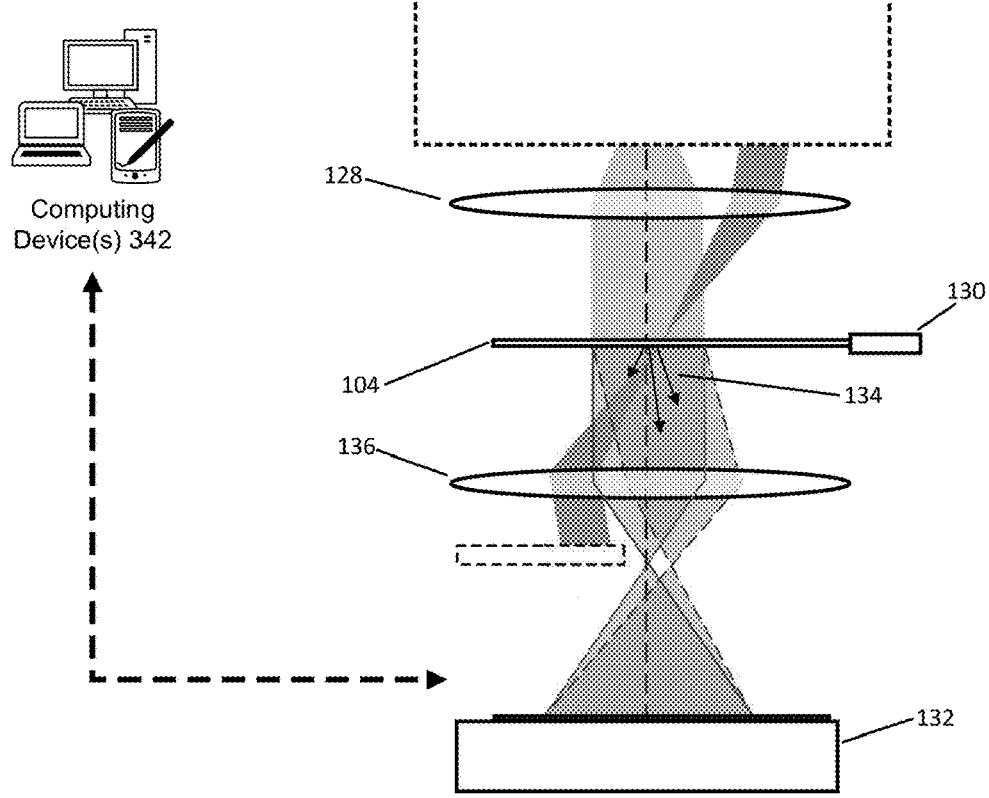

FIG. 7 is an illustration of an example embodiment 700 of bifocal multibeam system(s) 100 for investigating a sample 104 where the bifocal beamformer comprises a MEMS device 702. The example bifocal multibeam system(s) 700 includes an electron source 106 that emits a plurality of electrons 108 along an emission axis 110 and towards an accelerator 120. The accelerator 120 accelerates/decelerates, focuses, and/or directs the first electron beam 114 and the second electron beam 116 towards a bifocal beamformer 112. FIG. 7 illustrates the accelerator 120 as being positioned upstream of bifocal beamformer 112, as discussed above, in other embodiments the bifocal beamformer 112 may be positioned between the electron source 106 and the accelerator 120.

In example bifocal multibeam system(s) 700, the bifocal beamformer 112 corresponds to a MEMS device 702. The MEMS device 702 defines a first aperture and a second aperture that are each configured to allow a portion of the plurality of electrons 108 to pass through the MEMS device 702. In this way, the first aperture and the second aperture split the plurality of electrons 108 into the first electron beam 114 and the second electron beam 116, respectively. FIG. 7 illustrates the first electron beam 114 as being an axial beam.

The MEMS device 702 further comprises a plurality of electrodes that are configured such that, when certain voltages are applied thereto, the electrodes generate a quadrupole electromagnetic field that applies at least a quadrupole lensing effect (i.e., dipole field, quadrupole field, hexapole field, octupole field, etc.) to the second electron beam 116. The quadrupole lensing effect focuses, stigmatizes, or otherwise modifies at least the second electron beam 116 such that the corresponding focal properties of the beams are made different. In some embodiments, the electrodes are configured such that the first electron beam 114 is not affected by the electromagnetic field generated by the electrodes and/or such an effect is reduced. Alternatively, or in addition, a portion of the electrodes may generate an electromagnetic field that applies a different lensing effect to the first electron beam 114 and the second electron beam 116.

FIG. 7 illustrates the MEMS device 702 as being positioned upstream of focusing component 120 that is configured to apply a lensing action that focuses at least one of the first electron beam 114 and the second electron beam 116. In the example bifocal multibeam system(s) 700 shown in FIG. 7, the focusing component corresponds to lens 120 that focuses, and/or directs the first electron beam 114 and the second electron beam 116 towards a focusing column 126. However, in other embodiments the accelerator 122 may be positioned between electron source 106 and the MEMS device 702, and the accelerator 122 may replace or augment the lens 704 (as illustrated in FIG. 1).

The focusing column 126 and the objective lens 128 focus the electron beams 114 and 116 so that they are incident on sample 104. Specifically, FIG. 7 illustrates the focusing column 126 focusing the second electron beam 116 so that is focused on the sample 104 and the first electron beam 114 such that it is not focused on the sample 104. FIG. 7 shows the second electron beam 116 as being a reference beam that passes through a thin portion of the sample 104, and the first electron beam 114 as being a TEM beam that is incident on the sample 104.

In some embodiments, the focal planes the first electron beam 114 and the second electron beam 116 are modified such that one of the beams is focused at a plane at or near the sample 104 and the other electron beam is focused at a plane which is located at least 0.1%, 1%, 10%, or 100% of the objective lens focal distance above and/or below the sample 104. Alternatively or in addition, the focal planes of the first electron beam 114 and the second electron beam 116 may be modified such that the diameter of one of the electron beams at the sample 104 is at least one of 5, 10, 20, 50, 100, 500, or 1000 times greater than the diameter of the other electron beam at the sample.

Figure 8:
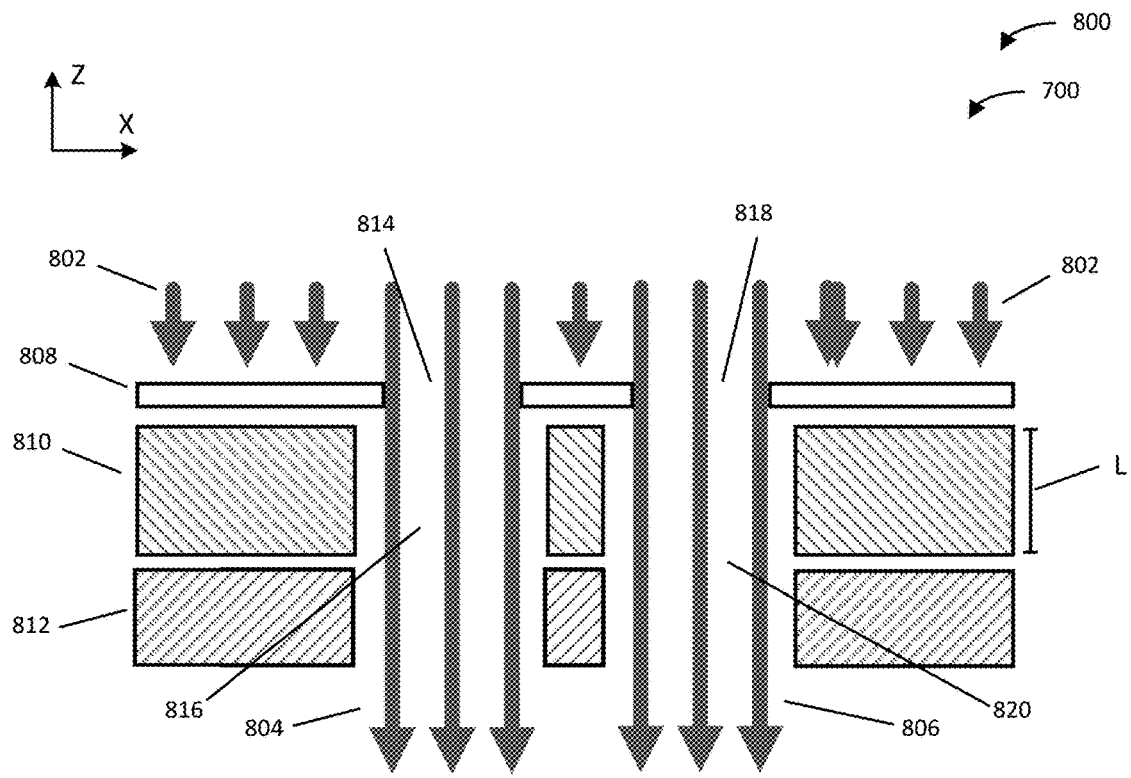
FIG. 8 illustrates an example MEMS device according to the present invention.

FIG. 8 shows a cross section of an example embodiment 800 of MEMS device 700 according to the present invention. Specifically, FIG. 8 illustrates a cross section of a MEMS device 700 configured to split a plurality of electrons 802 into the first electron beam 804 and the second electron beam 806, and generate an electromagnetic field pattern that applies at least a quadrupole lensing effect to the second electron beam 806. The at least the quadrupole lensing effect causes the first electron beam 804 and the second electron beam 806 to have different focal properties. For example, the quadrupole lensing effect may apply a positive lensing effect in one meridional plane (e.g. an y-z plane) and a negative lensing effect in a perpendicular meridional plane (e.g., a x-z plane), causing a different change to the focal properties in each of the two meridional planes. In such embodiments, another system component (e.g., a corrector or stigmator) may be included downstream of the bifocal beamformer 700 to apply another quadrupole lensing effect to make the beam cylindrically symmetric again.

FIG. 8 illustrates MEMS device 700 as including a surface layer 808, an electrode layer 810, and an optional shielding layer 812. In FIG. 8, the surface layer 808 is shown as comprising a thin material (e.g., a foil) upon which the electrons 802 are incident. However, a person having skill in the art would understand that in other embodiments, the surface layer 808 may not be a correspond to separate component layer, but rather correspond to an upper surface of one or more components of the MEMS device 700 upon which the electrons 802 are incident.

The surface layer 808 defines a first entrance 814 to a first aperture 816 and a second entrance 818 to a second aperture 820. In some embodiments, the first aperture 814 is an axial aperture (i.e., positioned on the emission axis of the electrons 802) and the second aperture 818 is a non-axial aperture. In such embodiments, the first electron beam 804 is an axial beam. The first entrance 814 allows a first portion of the electrons 802 (i.e., the first electron beam 804) to pass into the first aperture 816 and through the MEMS device 700. Similarly, the second entrance 818 allows a second portion of the electrons 402 (i.e., the second electron beam 806) to pass into the second aperture 820 and through the MEMS device 700. The surface layer 808 inhibits the ability of the remaining portions of electrons 802 to pass into and/or through the MEMS device 700.

The electrode layer 810 comprises a plurality of microelectrodes that are shaped, positioned, or otherwise configured such that when corresponding voltages are applied to the one or more electrodes, the one or more electrode generate electromagnetic field patterns that apply a lensing effect to one or both of the first electron beam 804 and the second electron beam 806. The lensing effect is such that the focal properties of the two beams are modified such that they have different corresponding focal properties. One or more of the magnitude of the voltages applied to the electrodes, the shape of the electrodes, and the thickness (L) of the electrodes can be modified to change the strength of the generated electromagnetic field patterns. According to the present invention, the electrodes in the electrode layer 810 are configured such that they generate at least a quadrupole electromagnetic field pattern applies at least a quadrupole lensing effect (i.e., dipole field, quadrupole field, hexapole field, octupole field, etc.) to the second electron beam 806. In some embodiments, the electromagnetic field pattern may also apply dipole fields to one or both of the first electron beam 804 and the second electron beam 806. Such dipole fields may cause at least one of the electron beams to be deflected in a direction perpendicular to the emission axis.

FIG. 8 also illustrates the MEMS device 700 as including an optional shielding layer 812 that is opposite the surface layer 808, and which is configured to at least partially insulate the first electron beam 814 from the at least quadrupole lensing effects applied to the second electron beam 816.

Figure 9:
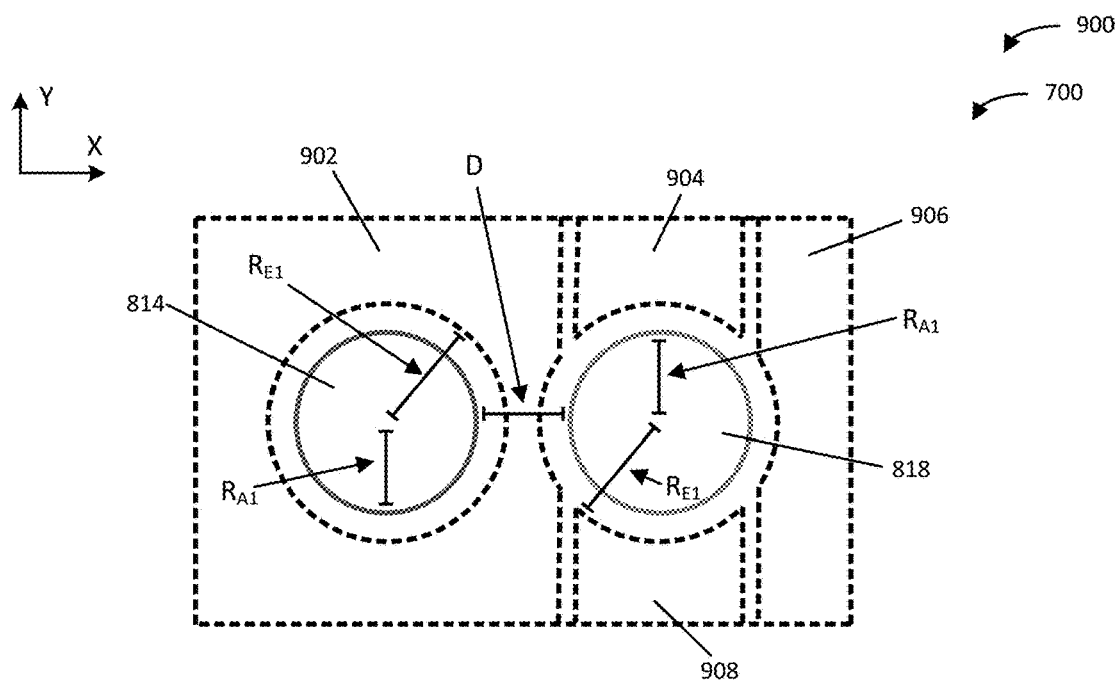
FIG. 9 illustrates a top down schematic view of an example embodiment of MEMS device that comprises four electrodes.
Figure 10:
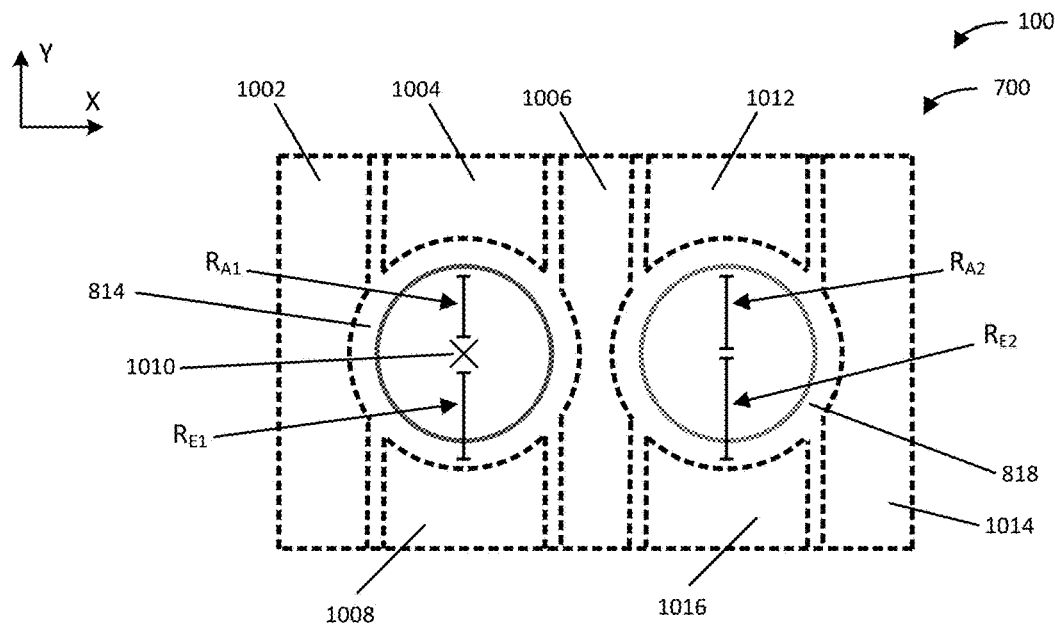
FIG. 10 illustrates a top down schematic view of an example embodiment of MEMS device that comprises seven electrodes.

FIG. 9 shows top down schematic view of an example embodiment 900 of MEMS device 700 that comprises four electrodes. FIGS. 9 and 10 illustrate in solid lines the first entrance 814 and second entrance 818 as defined by surface layer 808 in solid lines. Additionally, FIGS. 9 and 10 illustrate the components of the electrode layer 810 in dashed lines. A person having skill in the art would recognize that the dashed lines do not represent the exact shape, but rather indicate general outlines electrodes in the electrode layer 810.

FIG. 9 shows the radius $R_{A1}$ of the first entrance 814 as being lesser than the radius $R_{E1}$ of the first aperture as at least partially defined by electrode 902. In an embodiment of example MEMS device 900, the radius $R_{A1}$ may be at or around 10 μm and the radius $R_{E1}$ may be at or around 14 μm or greater. The radius $R_{A2}$ of the second entrance 818 is shown in FIG. 9 as being lesser than the radius $R_{E2}$ of the second aperture as at least partially defined by electrodes 902, 904, 906, and 908. However, in other embodiments one or both of radius $R_{E1}$ and radius $R_{A1}$ and/or radius $R_{E2}$ and radius $R_{A2}$ may be the same. The example embodiment 900 is further shown as having the radius $R_{A1}$ and the radius $R_{A2}$ as being equal and/or approximately equal, however this is not required for all embodiments. The first entrance 814 and the second entrance 818 are separated by the distance D.

During use of the example MEMS device 900, voltages may be applied to one or more of the electrodes 902-908 such that the electrodes generate an electromagnetic field that applies at least a quadrupole lensing effect to the second electron beam. In some embodiments, one or more of the electrodes may be grounded. For example, the example MEMS device 900 may generate an electromagnetic field that applies at least a quadrupole lensing effect to the second electron beam when a first voltage V1 is applied the electrode 904, a second voltage V2 is applied to electrode 908, and electrodes 902 and 906 are grounded. In various embodiments, V1 and V2 may each be greater than −20V and less than 20V, however larger voltages can also be used.

FIG. 10 shows top down schematic view of an example embodiment 1000 of MEMS device 700 that comprises seven electrodes. FIG. 10 shows the radius $R_{A1}$ of the first entrance 814 as being lesser than the radius $R_{E1}$ of the first aperture as at least partially defined by electrodes 1002, 1004, 1006, and 1008. FIG. 10 illustrates the first aperture 814 as being an axial aperture through which the emission axis 1010 of the plurality of electrons passes.

The radius $R_{A2}$ of the second entrance 818 is also shown in FIG. 10 as being lesser than the radius $R_{E2}$ of the second aperture as at least partially defined by electrodes 1006, 1012, 1014, and 1016. However, in other embodiments one or both of radius $R_{E1}$ and radius $R_{A1}$ and/or radius $R_{E2}$ and radius $R_{A2}$ may be the same.

During use of the example MEMS device 1000, voltages may be applied to one or more of the electrodes 1002-1008 and 1012-1016 such that the electrodes generate an electromagnetic field that applies at least a quadrupole lensing effect to the second electron beam. In some embodiments, one or more of the electrodes may be grounded. For example, the example MEMS device 1000 may generate an electromagnetic field that applies at least a quadrupole lensing effect to the second electron beam when a first set of voltages between the values of −20V and 20V are applied to electrodes 1004, 1008, 1012, and 1016, a second set of voltages between the values of −5V and 5V is applied to electrodes 1002 and 1014, and electrode 1006 is grounded.

Additionally, a person having skill in the art would understand that the dashed lines in FIGS. 9 and 10 represent example configurations of electrodes, and that experimentation would provide multiple electrode configurations (e.g., electrode size, electrode shape, quantity of electrodes, layout of electrodes, combination of voltages applied to electrodes, etc.) that cause the electrodes to generate an electromagnetic field that applies at least a quadrupole lensing effect to the second electron beam. Moreover, while each of FIGS. 5 and 6 illustrate an embodiment where the at least quadrupole lensing effect is applied to the second electron beam, in other embodiments the electrode layer may be configured to generate an electromagnetic field that applies at least a quadrupole lensing effect to the first electron beam (or both electron beams) when a corresponding set of voltages are applied to the electrodes.

Figure 11:
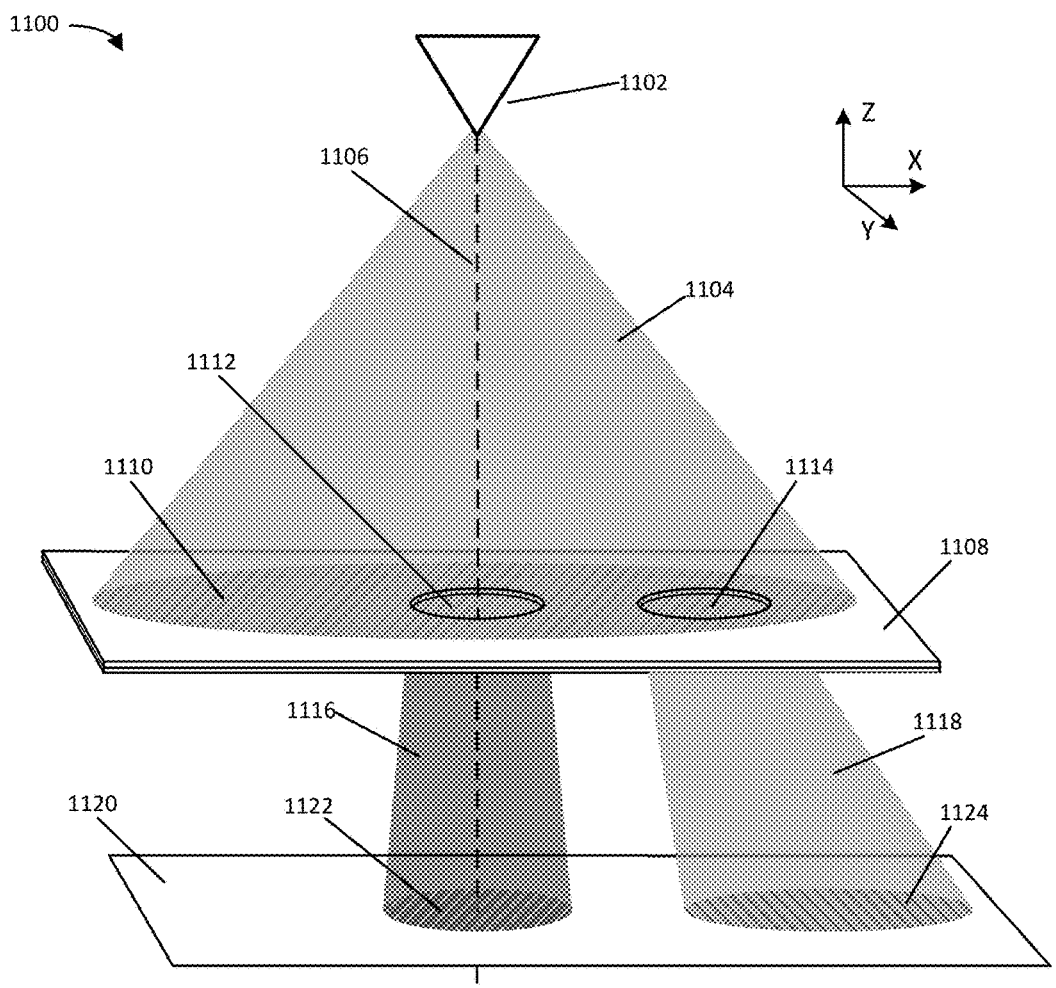
FIG. 11 illustrates the distortion of the second electron beam caused when an example embodiment bifocal beamformer causes at least a quadrupole lensing effect to be applied thereto.

FIG. 11 is an illustration 1100 of the change in focal properties of the second electron beam caused when an example embodiment bifocal beamformer causes at least a quadrupole lensing effect to be applied thereto. Specifically, FIG. 11 shows an emitter 1102 emitting a plurality of electrons 1104 along an emission axis 1106. The plurality of electrons 1104 strike the bifocal beamformer 1108 in a circular area 1110. The bifocal beamformer 1108 is shown in FIG. 11 as being a MEMS device that (i) defines a first aperture 1112 and a second aperture 1114 that split the electron beam 1104 into a first electron beam 1116 and a second electron beam 1118, respectively, and (ii) generates an electromagnetic field that applies at least a quadrupole lensing effect to the second electron beam 1118 when in use.

As illustrated in FIG. 11, in some embodiments the at least a quadrupole lensing effect causes the second electron beam 1118 to be distorted such that it (i) has a different focal properties from the first electron beam 1116, and (ii) is no longer a cylindrically symmetric beam. Specifically, FIG. 11 shows the cross-sectional areas of the first electron beam 1116 and the second electron beam 1118 in an plane 1120 downstream of the bifocal beamformer 1108, where the emission axis is normal to the plane 1120. The first electron beam 1116 is shown as having a circular (or near circular) cross section 1122 when it crosses the plane 1120, and the second electron beam 1118 is shown as having a non-circular cross section 1124 when it crosses the plane 1120. Applicant notes that these cross sections are not illustrative of the performance of all embodiments of bifocal beam-formers according to the present invention, but are limited to the specific example embodiment of bifocal beamformer 1108.

Figure 12:
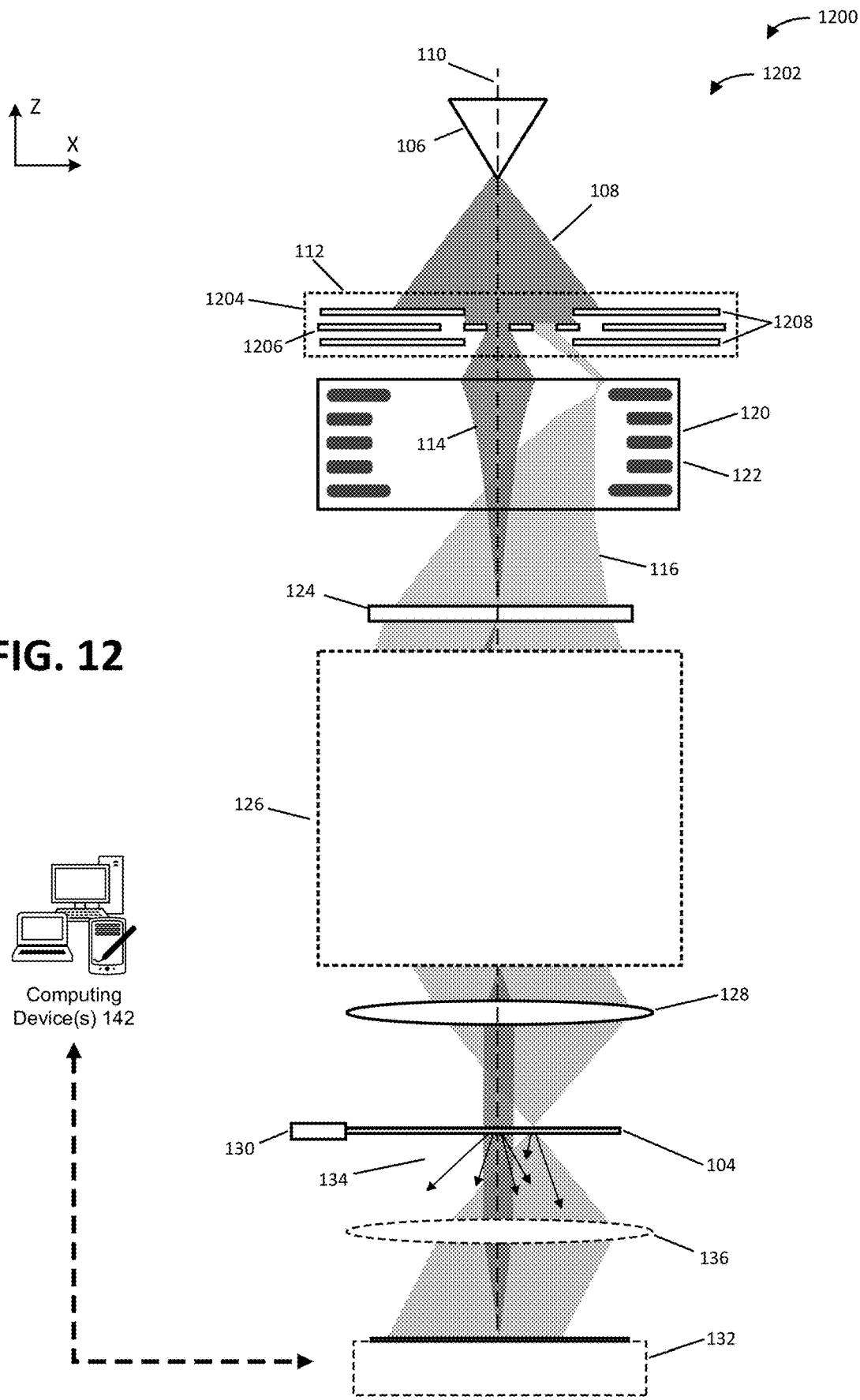
FIG. 12 illustrates example embodiments of bifocal multibeam systems for investigating a sample where the bifocal beamformer comprises an aperture lens array.

FIG. 12 is an illustration of an example embodiment 1200 of bifocal multibeam system(s) 100 for investigating a sample 104 where the bifocal beamformer comprises an aperture lens array 1203.

The example bifocal multibeam system(s) 1202 includes an electron source 106 that emits a plurality of electrons 108 along an emission axis 110 and towards an aperture lens array 1204. The aperture lens array 1204 comprises at least one aperture defining structure 1206 that defines (i) a first aperture that allows the first electron beam 114 to pass through the at least one aperture defining structure 1206, (ii) a second aperture that allows the second electron beam 116 to pass through the at least one aperture defining structure 1206, and (iii) plurality of other apertures. The first aperture, the second aperture, and the plurality of apertures collectively form a pattern that, when a voltage(s) is applied to the aperture defining structure 1206 and the electrode(s) 1208, creates an electromagnetic field that applies a lensing effect (e.g., at least a quadrupole lensing effect) to at least one of the first electron beam 114 and the second electron beam 116. The lensing effect distorts one or both of the first electron beam 114 and the second electron beam 116 such that they have different focal properties.

The aperture lens array 1204 further comprises one or more electrodes (e.g., disk electrodes) 1208. The each of the one or more electrodes 1208 generate an electric field between the corresponding electrode and the at least one aperture defining structure 1206 when a voltage is supplied thereto. Additionally, in some embodiments, one or more of the electrodes 1208 may physically block a portion of the plurality of electrons 108 from reaching the at least one aperture defining structure 106. For example, one of the electrodes 1208 may define a first aperture that allows a first portion of electrons to pass through the electrode (i.e., a first electron beam) and a second aperture that allows a second portion of electrons to pass through the electrode (i.e., a second electron beam).

FIG. 12 illustrates the bifocal beamformer 112 as being positioned upstream of focusing component 120 that is configured to apply a lensing action that focuses at least one of the first electron beam 114 and the second electron beam 116. In the example bifocal multibeam system(s) 1202 shown in FIG. 12, the focusing component corresponds to an accelerator 122 that accelerates/decelerates, focuses, and/or directs the first electron beam 114 and the second electron beam 116 towards a focusing column 126.

The focusing column 126 and the objective lens 128 focus the electron beams 114 and 116 so that they are incident on sample 104. Specifically, FIG. 12 illustrates the focusing column 126 focusing the second electron beam 116 so that is focused on a plane at or near the sample 104 and the first electron beam 114 such that it is not focused at the plane at or near the sample 104. In some embodiments, the focal properties of the first electron beam 114 and the second electron beam 116 are modified such that one of the beams is focused at a plane at or near the sample 104 and the other electron beam is focused at a plane which is located at least 0.1%, 1%, 10%, or 100% of the objective lens focal distance above and/or below the sample 104. Alternatively or in addition, the focal properties the first electron beam 114 and the second electron beam 116 may be modified such that the diameter of one of the electron beams at the sample 104 is at least one of 50, 100, 500, or 1000 times greater than the diameter of the other electron beam at the sample.

Figure 13:
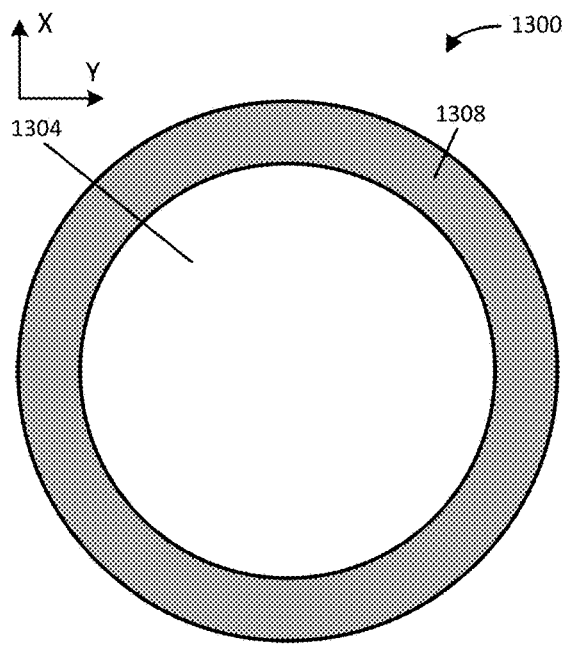
FIG. 13 illustrates an example electrode for an example aperture lens array.

FIG. 13 illustrates an example 1300 electrode 1202 for an example aperture lens array 1204. The electrode 1208 is shown in FIG. 13 as being a disk electrode 1302 that defines an aperture 1304 that allows electrons to pass through the disk electrode 1302.

Figure 14:
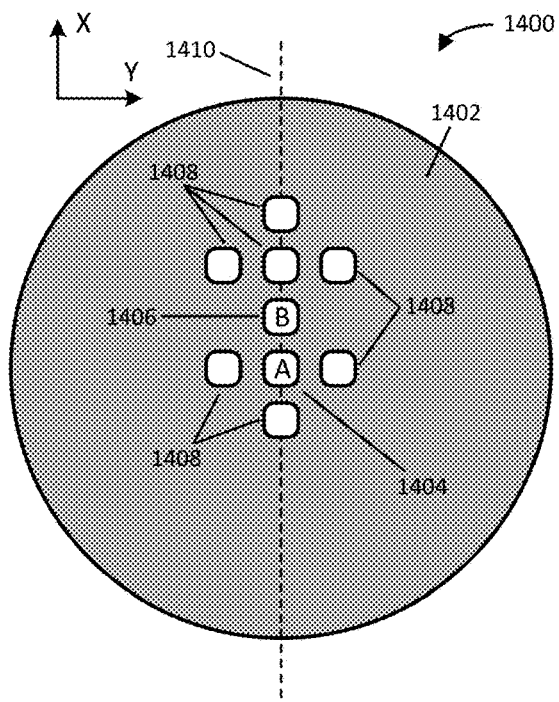
FIG. 14 illustrates an example aperture defining structure for an example aperture lens array.

FIG. 14 illustrates an example 1400 aperture defining structure 1402 for an example aperture lens array 1204. The example aperture defining structure 1402 defines (i) a first aperture 1404 that allows a first electron beam to pass through the at least one aperture defining structure 1402, (ii) a second aperture 1406 that allows a second electron beam to pass through the at least one aperture defining structure 1402, and (iii) plurality of other apertures 1408. In the example embodiment shown in FIG. 14, each of the first aperture 1404, the second aperture 1406, and three apertures 1408 are positioned along a midline 1410 of the aperture defining structure 1402.

FIG. 14 illustrates each of the plurality of other apertures 1408 as being holes that allow electrons to pass through the aperture defining structure 1402. However, in other embodiments one or more of the apertures 1408 may be cavities where the aperture defining structure 1402 defines an empty space into which electrons are allowed to enter, but which do not allow the electrons to pass through the aperture defining structure. The first aperture 1404, the second aperture 1406, and the plurality of apertures 1408 collectively form a pattern that induces an electromagnetic field that applies a lensing effect (e.g., at least a quadrupole lensing effect) to at least the second electron beam.

Figure 15:
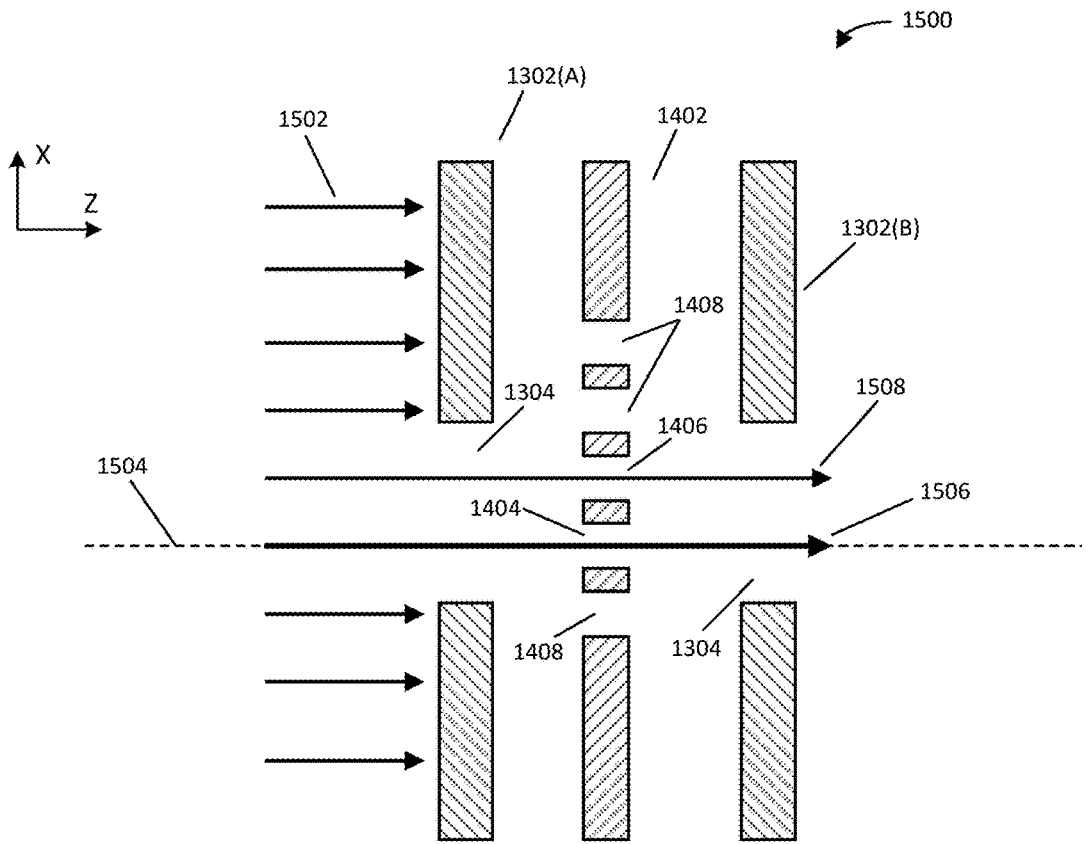
FIG. 15 illustrates a cross section of an example aperture lens array having one aperture defining structure.

FIG. 15 illustrates a cross section of an example aperture lens array 1500 having one aperture defining structure. Specifically, FIG. 15 shows a cross section of an example aperture lens array 1500 comprising the example electrode 1302 of FIG. 13 and the example aperture structure 1402 of FIG. 14, where the cut of the cross section aligns with the midline 1410 of the example aperture structure 1402.

FIG. 15 shows electrons 1502 being emitted along an emission axis toward the electrode 1302. A portion of the electrons 1502 pass through both the aperture 1304 and the first aperture 1404, becoming first electron beam 1506. Another portion of the electrons 1502 pass through both the aperture 1304 and the second aperture 1406, becoming second electron beam 1508. In some embodiments, the aperture lens array 1500 includes a second electrode positioned such that the at least one aperture defining structure 1402 is between the two electrodes. When voltages are applied to the electrode 1302(A), the electrode 1302(B), both electrodes 1302(A) and 1302(B), and/or the aperture defining structure 1402, electromagnetic fields are created between the electrodes 1302 and the aperture defining structure 1402. While FIG. 15 illustrates the aperture lens array 1500 as comprising two electrodes, in some embodiments the aperture lens array 1500 may only include one electrode (either electrodes 1302(A) or 1302(B)).

The aperture lens array 1500 is configured such that the configuration of the electrodes 1302 (i.e., one electrode, both electrodes, the positions of such electrodes, the geometry of such electrodes, etc.), the voltages (or lack of voltages) applied to individual ones of the electrodes 1302 and the aperture defining structure 1402, and the pattern that the first aperture 1404, the second aperture 1406, and the plurality of apertures 1408 collectively create an electromagnet field that creates a first lensing effect on the first electron beam and a second lensing effect on the second electron beam, where the first and second lensing effects are different. For example, in an embodiment of the present invention, the electromagnetic field may create a lensing effect (e.g., at least a quadrupole lensing effect) that causes the first electron beam 1506 and the second electron beam 1508 to have different focal properties.

In some embodiments, the electromagnetic field also deflects one or both of the first electron beam 1506 and the second electron beam 1508 away from the emission axis 1504. Also, while FIG. 15 illustrates the first electron beam 1508 as an axial beam that travels along the emission axis 1504 of the plurality of electrons 1502, this is not required in all embodiments.

Figure 16:
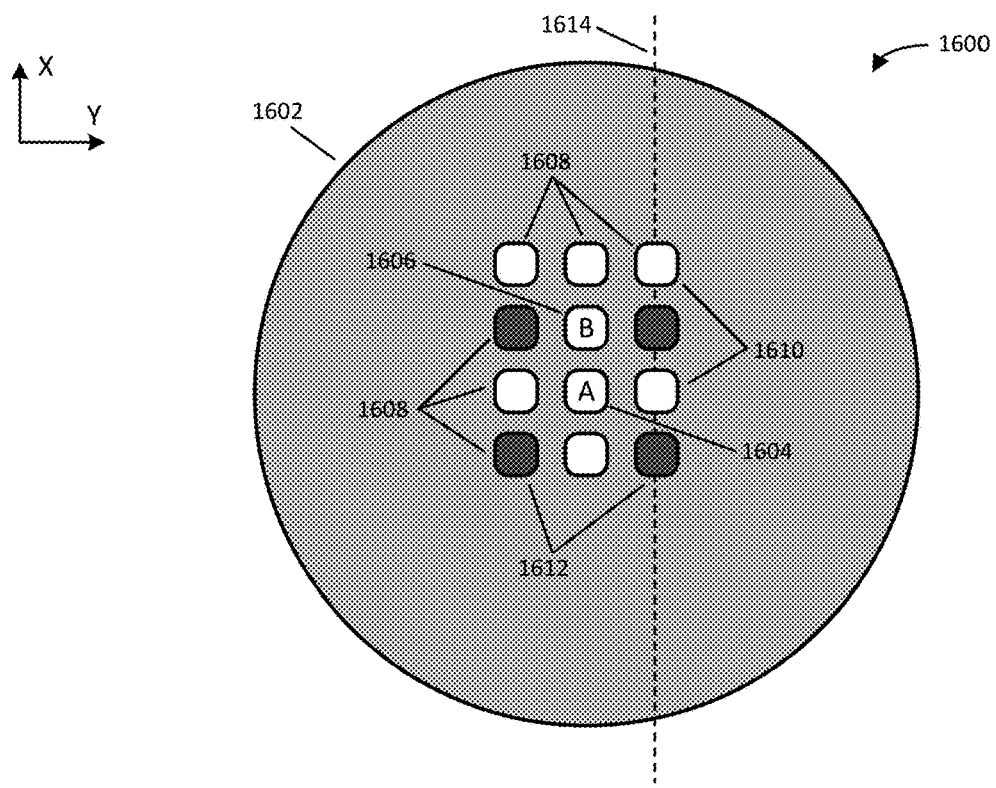
FIGS. 16-24 illustrate example central structures which can be used in the multiple aperture assembly illustrated in FIG. 23.
Figure 23:
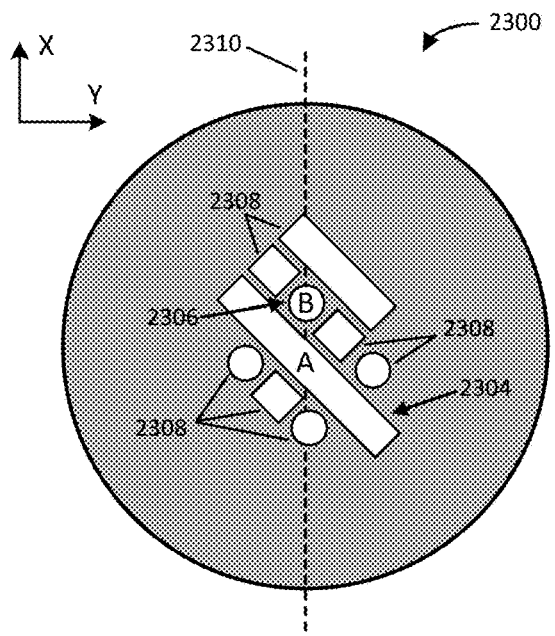
Figure 24:
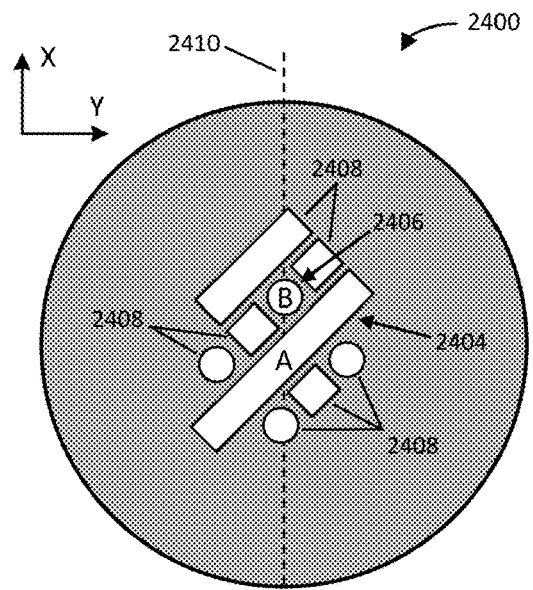
Figure 25:
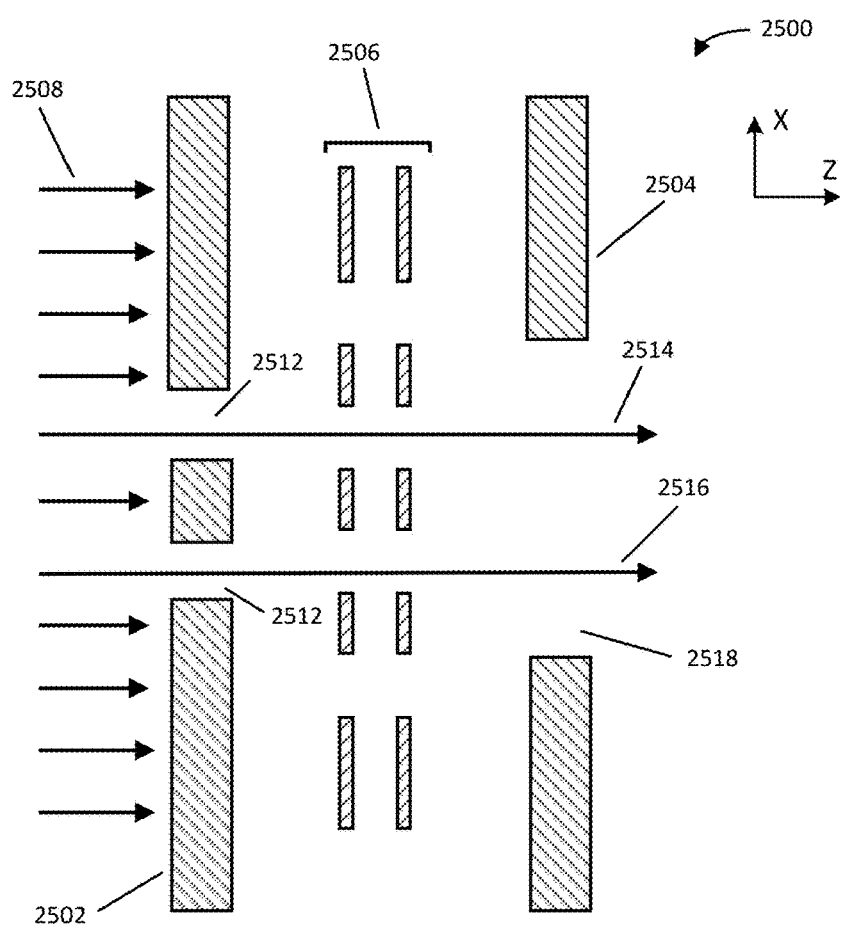
FIG. 25 illustrates a cross section of an example aperture lens array that comprises a first electrode, a second electrode, and an aperture defining structure.

FIGS. 16-24 show example central structures which can be used in the multiple aperture assembly 2500 illustrated in FIG. 25. Specifically, FIG. 16 illustrates an example aperture defining structure 1600 for an example aperture lens array that includes a combination of holes and cavities. The example aperture defining structure 1602 defines (i) a first aperture 1604 that allows a first electron beam to pass through the at least one aperture defining structure 1602, (ii) a second aperture 1606 that allows a second electron beam to pass through the at least one aperture defining structure 1602, and (iii) plurality of other apertures 1608. The first aperture 1604, the second aperture 1606, and the plurality of apertures 1608 collectively form a pattern that induces an electromagnetic field that applies a lensing effect (e.g., at least a quadrupole lensing effect) to at least the second electron beam when voltages are applied to at least the aperture defining structure 1600 and electrodes 2504 and 2512 during use of the multiple aperture assembly 2500. In some embodiments, the aperture lens structure 1602 comprises a single physical component that defines each of the first aperture 1604, the second aperture 1606, and the plurality of apertures 1608. However, in other embodiments the aperture lens structure 1602 may comprise two or more component physical structures.

FIG. 16 illustrates an example embodiment in which five of the plurality of other apertures 1608 correspond to holes 1610, and four of the plurality of other apertures 1608 correspond to cavities 1612. However, in other embodiments the plurality of other apertures 1608 may comprise other combinations and/or patterns of holes and cavities, including embodiments where all of the plurality of other apertures 1608 correspond to one of holes (e.g., the aperture defining structure illustrated in FIG. 14) or cavities, exclusively. In the example embodiment shown in FIG. 16, each of the first aperture 1604, the second aperture 1606, and two other apertures 1608 are positioned along a line 1614 of the aperture defining structure 1602.

Figure 17:
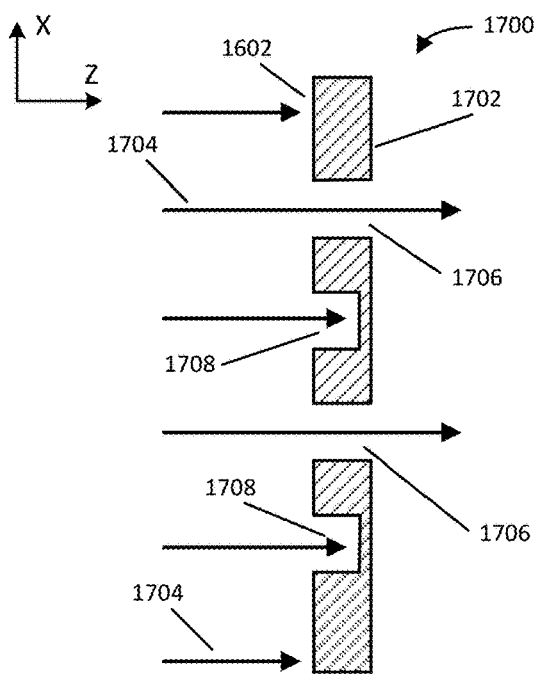

FIG. 17 illustrates a cross section 1700 of example aperture structure 1602 that comprises a single physical structure 1702. Specifically, FIG. 17 shows a cross section of an embodiment of the example aperture structure 1602 of FIG. 16, with the cut of the cross section aligning with the line 1614. A first portion of the electrons 1704 are allowed to pass through the physical structure 1702 via holes 1706. FIG. 17 further shows a second portion of the electrons 1704 are allowed to pass into cavities 1708 that prevent them from passing through the physical structure 1702.

Figure 18:
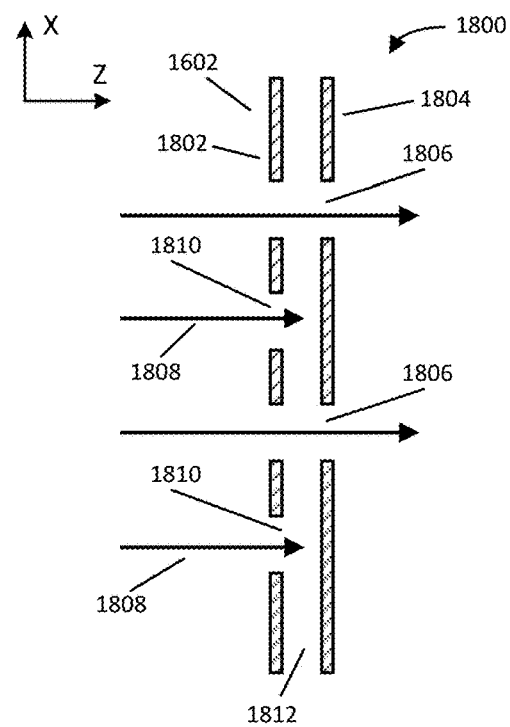

FIG. 18 illustrates a cross section 1800 of example aperture structure 1602 that comprises a first physical structure 1802 and a second physical structure 1804. Specifically, FIG. 18 shows a cross section of an embodiment of the example aperture structure 1602 where it is comprised of two structures (e.g., foils), with the cut of the cross section aligning with the line 1614. FIG. 18 illustrates holes 1806 in the example aperture structure 1602 as corresponding to complementary apertures in the first physical structure 1802 and a second physical structure 1804 that together allow a first portion of the electrons 1808 to pass through the aperture structure 1602. FIG. 18 also illustrates cavities 1810 as corresponding to apertures in the first physical structure 1802 that do not have a complimentary aperture in the second physical structure 1804. In other words, the cavities 1810 are configured such that a second portion of the electrons 1808 is allowed to pass into a space 1812 between the first physical structure 1802 and the second physical structure 1804, but are not allowed to pass through the aperture structure 1602.

Figure 19:
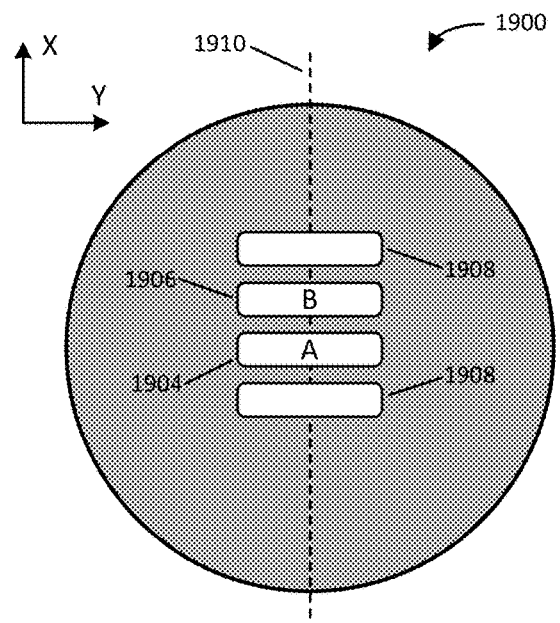
Figure 20:
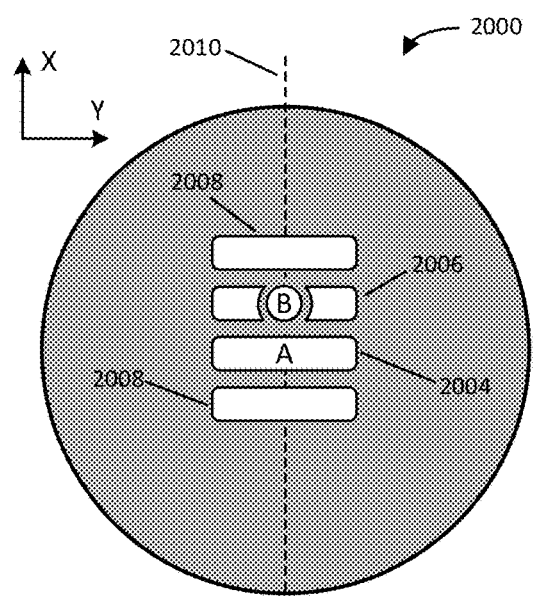

FIGS. 19 and 20 illustrate a pair of component physical structures that can be used to form an aperture defining structure 2306 in the aperture lens array 2500 illustrated in FIG. 25. Specifically, FIG. 19 illustrates an example first component physical structure 1900 of an example aperture defining structure comprising two physical structures. The example first component physical structure 1900 defines (i) a first aperture 1904 that allows a first electron beam to pass through the first component physical structure 1900, (ii) a second aperture 1906 that allows a second electron beam to pass through first component physical structure 1900, and (iii) plurality of other apertures 1908. Each of these apertures are illustrated as having a rectangular geometry (e.g., a long slot). Such rectangular apertures are configured to create a cylindrical lensing effect on electrons passing through them during use of the example aperture defining structure. In the example embodiment shown in FIG. 19, each of the first aperture 1904, the second aperture 1906, and two apertures 1908 are positioned along a midline 1910 of the first component physical structure 1900.

FIG. 20 illustrates an example second component physical structure 2000 of an example aperture defining structure comprising two physical structures. The example second component physical structure 2000 defines (i) a first aperture 2004 that allows a first electron beam to pass through the second component physical structure 2000, (ii) a second aperture 2006 that allows a second electron beam to pass through second component physical structure 2000, and (iii) plurality of other apertures 2008. Apertures 2004 and 2008 are shown as having a rectangular geometry, similar to the apertures defined by the first component physical structure 1900 illustrated in FIG. 19. The second aperture 2006 is illustrated in FIG. 20 as combining both a rectangular geometry and a circular geometry. In other words, the second aperture 2006 is shown as being a circular aperture centrally positioned and overlaid with an aperture having a rectangular geometry. This combination of the geometry of the second aperture 1906 and the second aperture 2006 cause a net quadrupole lensing effect to be applied to the electron beam B as it passes through the second apertures 1906 and 2006. Similarly, the geometries of the first aperture 1904 and the first aperture 2004 cause a no net lensing effect to be applied to the electron beam A. In the example embodiment shown in FIG. 20, each of the first aperture 2004, the second aperture 2006, and two apertures 2008 are positioned along a midline 2010.

Figure 21:
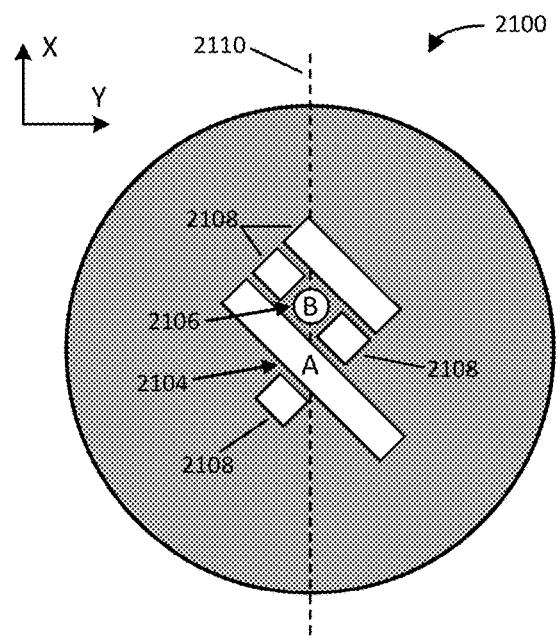

FIGS. 21 and 20 illustrate a pair of component physical structures that can be used to form an aperture defining structure 2306 in the aperture lens array 2500 illustrated in FIG. 25. Specifically, FIG. 21 illustrates an example first component physical structure 2100 of an example aperture defining structure comprising two physical structures. The example first component physical structure 2100 defines (i) a first aperture 2104 that allows a first electron beam to pass through the first component physical structure 2100, (ii) a second aperture 2106 that allows a second electron beam to pass through first component physical structure 2100, and (iii) plurality of other apertures 2108. Such apertures are configured to create a quadrupole lensing effect on electrons passing through the second aperture 2106 during use of the example aperture defining structure. In the example embodiment shown in FIG. 21, each of the first aperture 2104, the second aperture 2106, and other apertures 2108 are positioned along a midline 2110 of the first component physical structure 2100.

Figure 22:
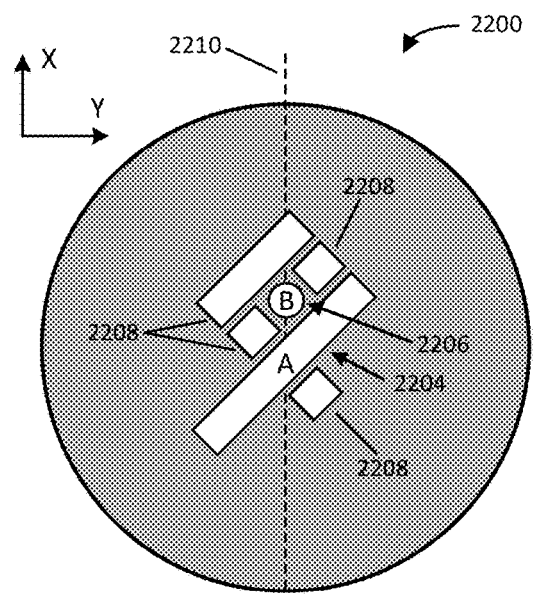

FIG. 22 illustrates an example second component physical structure 2200 of an example aperture defining structure comprising two physical structures. The example second component physical structure 2200 defines (i) a first aperture 2204 that allows a first electron beam to pass through the second component physical structure 2200, (ii) a second aperture 2206 that allows a second electron beam to pass through second component physical structure 2200, and (iii) plurality of other apertures 2208. Apertures 2204 and 2208 are shown as having a geometry similar to the apertures defined by the first component physical structure 2200 illustrated in FIG. 22. The combination of the geometry of the second aperture 2106 and the second aperture 2206 causes no net lensing effect to be applied to the electron beam A Similarly, the geometries of the first aperture 2104 and the first aperture 2204 cause a net quadrupole lensing effect to be applied to the electron beam B as it passes through the second apertures 2106 and 2206. In the example embodiment shown in FIG. 22, each of the first aperture 2204, the second aperture 2206, and two apertures 2028 are positioned along a midline 2210.

FIGS. 23 and 24 illustrate a pair of component physical structures that can be used to form an aperture defining structure 2506 in the aperture lens array 2500 illustrated in FIG. 25. Specifically, FIG. 23 illustrates an example first component physical structure 2300 of an example aperture defining structure comprising two physical structures. The example first component physical structure 2300 defines (i) a first aperture 2304 that allows a first electron beam to pass through the first component physical structure 2300, (ii) a second aperture 2306 that allows a second electron beam to pass through first component physical structure 2300, and (iii) plurality of other apertures 2308. Each of these apertures are illustrated as having a rectangular geometry (e.g., a long slot). Such rectangular apertures are configured to create a cylindrical lensing effect on electrons passing through them during use of the example aperture defining structure. In the example embodiment shown in FIG. 23, each of the first aperture 2304, the second aperture 2306, and two apertures 2308 are positioned along a midline 2310 of the first component physical structure 2300.

FIG. 24 illustrates an example second component physical structure 2400 of an example aperture defining structure comprising two physical structures. The example second component physical structure 2400 defines (i) a first aperture 2404 that allows a first electron beam to pass through the second component physical structure 2400, (ii) a second aperture 2406 that allows a second electron beam to pass through second component physical structure 2400, and (iii) plurality of other apertures 2408. Apertures 2404 and 2408 are shown as having a rectangular similar to the apertures defined by the first component physical structure 2300 illustrated in FIG. 23. This combination of the geometry of the second aperture 2306 and the second aperture 2406 causes no net lensing effect to be applied to the electron beam A. Similarly, the geometries of the first aperture 2304 and the first aperture 2404 cause a net quadrupole lensing effect to be applied to the electron beam B that passes through the second apertures 2306 and 2406. In the example embodiment shown in FIG. 24, each of the first aperture 2404, the second aperture 2406, and two apertures 2408 are positioned along a midline 2410.

FIG. 25 illustrates a cross section of an example aperture lens array 2500 comprising a first electrode 2502, a second electrode 2504, and an aperture defining structure 2506. FIG. 25 shows electrons 2508 being emitted toward a first electrode 2502. The first electrode 2502 is shown as defining a pair of apertures 2512 that allow a portion of the electrons 2508 to pass through the first electrode 2502. In some embodiments, the first electrode 2502 may correspond to an electrically conductive foil that defines the two apertures 2512. A first portion of the electrons 2508 pass through both a first aperture becoming first electron beam 2514. Another portion of the electrons 2508 pass through both the second aperture becoming second electron beam 2516.

In all embodiments, the aperture lens array 2500 includes a second electrode 2504 positioned such that the aperture defining structure 2506 is between the two electrodes. The second electrode 2504 may correspond to a disk electrode defining an aperture 2518 that allows the first electron beam 2514 and the second electron beam 2516 pass through the second electrode 2504.

When certain voltages are applied to both the electrodes 2502 and 2504, and/or aperture defining structure 2506, electromagnetic fields are created between the electrodes 2502 and 2504. The electromagnetic fields and the pattern that the apertures defined by the aperture defining structure 2506 collectively create a lensing effect that causes the first electron beam 2514 and the second electron beam 2516 to have different focal planes.

While non-limiting, a simple representative calculation can be used to illustrate the performance of some embodiments of the present invention having different array patterns for the upstream and downstream components (e.g., the embodiment depicted in FIGS. 19 and 20, the embodiment depicted in FIGS. 21 and 22, the embodiment depicted in FIGS. 23 and 24). To enable this simple representative calculation, the following paragraphs assume that (a) $|\phi_0(z)| \ll U$ everywhere, (b) the field component $E_z = -\phi_0'(z)$ close to the aperture array plates changes from $E_{up}$ (i.e., the nonzero electric field above the aperture defining structure 2506) to 0 in above the aperture defining structure 2306, (c) the field component $E_z = -\phi_0'(z)$ close to the aperture array plates changes from 0 to $E_{low}$ (i.e., the nonzero electric field below the aperture defining structure 2506) below the aperture defining structure 2506, and (d) the field between the array plates is a zero field (e.g. the plates in FIGS. 19 and 20).

In the simple representative calculation, the electrostatic potential up to order 2 in the x and y direction can be generally expressed as:

$$\phi(x,y,z) = U + \phi_0(z) + p\phi_0''(z)x^2 + q\phi_0''(z)y^2 + \phi_2(z)(x^2-y^2), \quad (1)$$

for an electrostatic potential that is mirror symmetric in the x-z plane and the y-z plane. In expression (1), U represents the electron energy above the aperture lens array 2500, and the other terms are induced by the voltages applied to both the electrodes 2502 and 2504, and/or aperture defining structure 2506. The Laplace equation ($\Delta\phi=0$) for this electrostatic potential dictates that $p+q=-1/2$. In some examples, this corresponds to $p=q=-1/4$ for a round aperture lens, and $p=-1/2$ and $q=0$ for a cylinder lens which focuses in the x-z plane (such as the embodiment depicted in FIG. 19).

According to the simple representative calculation, the upstream component of the aperture defining structure 2506 invokes lens strengths:

$$\kappa_{x,up} = f_{x,up}^{-1} = U^{-1}(-p_{up}E_{up} - Q_{up}); \text{ and } \kappa_{y,up} = f_{y,up}^{-1} = U^{-1}(-q_{up}E_{up} + Q_{up}); \quad (2)$$

Similarly, the downstream component of the aperture defining structure 2506 invokes lens strength:

$$K_{x,low} = f_{x,low}^{-1} = U^{-1}(p_{low}E_{low} - Q_{low}); \text{ and } \kappa_{y,low} = f_{y,low}^{-1} = U^{-1}(q_{low}E_{low} + Q_{low}); \quad (3)$$

In these equations, $f_x$ and $f_y$ are the focal distances in the x-z plane and the y-z plane, respectively, and $U^{-1}Q_{up}$ and $U^{-1}Q_{low}$ are the quadrupole lens strengths induced by the quadrupole potential $\phi_2(z)(x^2-y^2)$.

In some preferred embodiments, $E_{up} = E_{low} \equiv E$. In such embodiments, the total lens strengths simplify to:

$$\kappa_x = \kappa_{x,up} + \kappa_{x,low} = U^{-1}((p_{low} - p_{up})E - Q); \text{ and} \quad (5)$$

$$\kappa_y = \kappa_{y,up} + K_{y,low} = U^{-1}((q_{low} - q_{up})E + Q). \quad (6)$$

Because $p_{up} + q_{up} = p_{low} + q_{low} = -1/2$, it follows that $\kappa_y = -\kappa_x$ in such embodiments, meaning that there is only a pure quadrupole lens action.

In embodiments of aperture lens array 2100 where the electromagnetic field is the same on both sides of the physical structures 1900 and 2000, the lensing effects caused by the first electron beam 2108 traveling through the first aperture 1904 are canceled and/or otherwise negated by the lensing effects caused by the first electron beam 2108 traveling through the first aperture 2004. Additionally, in such an embodiment, the lensing effects caused by the second electron beam 2110 traveling through the second aperture 1906 and the lensing effects caused by the second electron beam 2110 traveling through the second aperture 2006 combine to form at least a quadrupole lensing effect.

Figure 26:
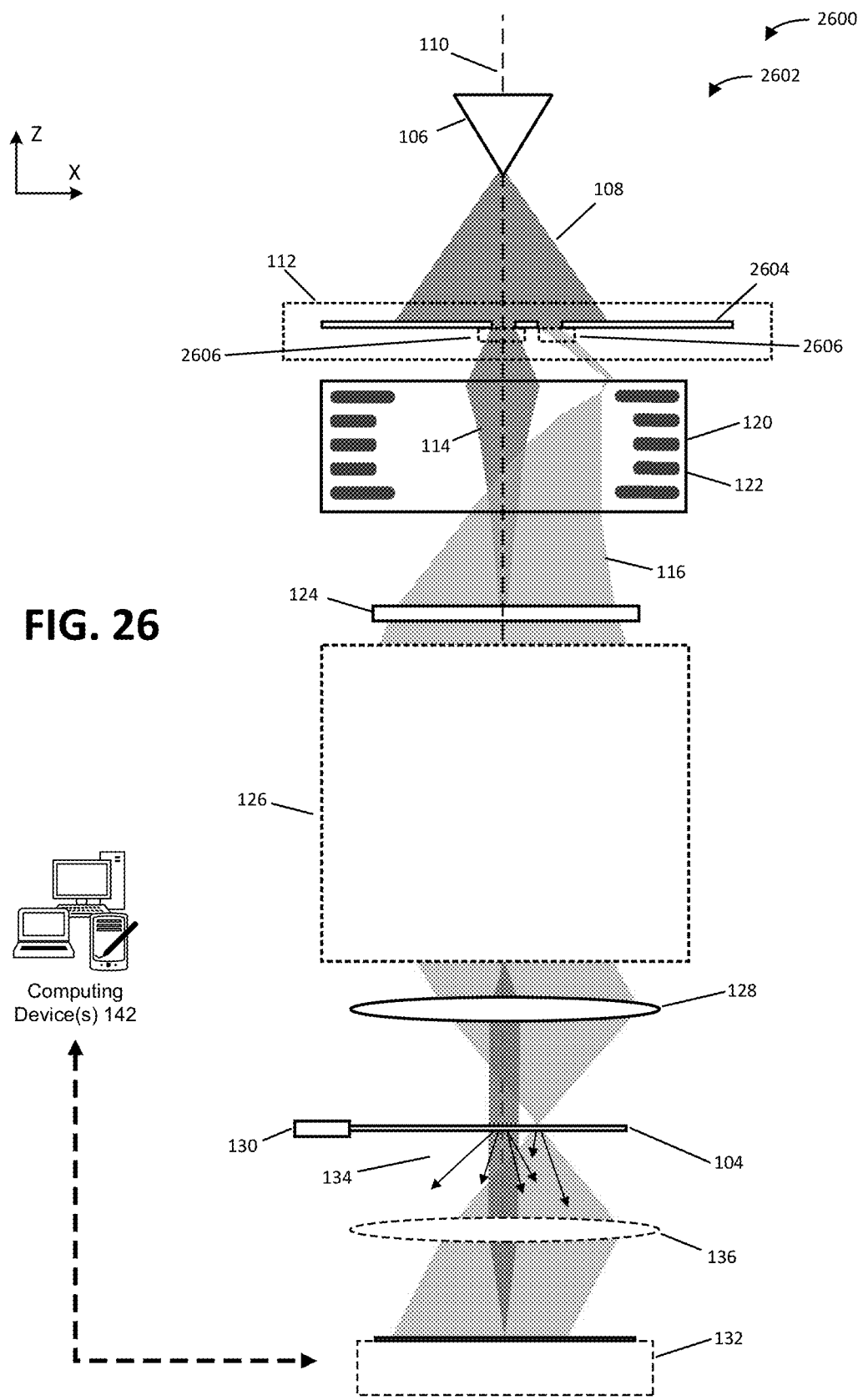
FIG. 26 illustrates example embodiments of bifocal multibeam systems for investigating a sample where the bifocal beamformer comprises a beam splitting mechanism and one or more focusing devices.

FIG. 26 is an illustration of an example embodiment 2600 of bifocal multibeam electron system(s) 100 for investigating a sample 104 where the bifocal beamformer 112 comprises a beamsplitting mechanism 2604 and one or more focusing devices 2606.

The example bifocal multibeam electron system(s) 2602 includes an electron source 106 that emits a plurality of electrons 108 along an emission axis 110 and towards the bifocal beamformer 112. In the illustrated embodiment of the present invention, the bifocal beamformer 112 is shown as comprising at least (i) a beamsplitting mechanism 2604 that splits the plurality of electrons 108 into the first electron beam 114 and the second electron beam 116, and (ii) one or more focusing devices 2606 configured to modify the focal properties of one or both of the electron beams such that the two beams do not have the same corresponding focal planes. In some embodiments, the one or more focusing devices 2606 are further configured to cause one or both of the first electron beam 114 and the second electron beam 116 to be deflected away from the emission axis 110.

In FIG. 26, the beamsplitting mechanism 2604 is shown as corresponding to a physical structure that defines a first aperture that allows the first electron beam 114 to pass through the beamsplitting mechanism 2604, and a second aperture that allows the second electron beam 116 to pass through the beamsplitting mechanism 2604. FIG. 26 further illustrates the one or more focusing devices 2606 as optionally corresponding to two lenses. However, in other embodiments the focusing devices 2606 may correspond to three or more lenses, a single lens that modifies only one of the electron beams, a single lens with a high degree of aberration such that the two electron beams that pass through the lens Additionally, while FIG. 26 illustrates the beamsplitting mechanism 2604 as being upstream of the one or more focusing devices 2606, in other embodiments of example bifocal multibeam electron systems 2602 the beamsplitting mechanism 2604 may be downstream of the one or more focusing devices 2606. Alternatively, in some embodiment some of the focusing devices 2606 may be upstream of the beamsplitting mechanism 2604, while others of the focusing devices 2606 may be downstream of the beamsplitting mechanism 2604.

FIG. 26 illustrates the bifocal beamformer 112 as being positioned upstream of focusing component 120 that is configured to apply a lensing action that focuses at least one of the first electron beam 114 and the second electron beam 116. In the example bifocal multibeam electron system(s) 2602 shown in FIG. 26, the focusing component corresponds to an accelerator 122 that accelerates/decelerates, focuses, and/or directs the first electron beam 114 and the second electron beam 116 towards a focusing column 126.

The focusing column 126 and the objective lens 128 focus the electron beams 114 and 116 so that they are incident on sample 104. Specifically, FIG. 26 illustrates the focusing column 126 focusing the second electron beam 116 so that is focused on the sample 104 and the first electron beam 114 such that it is not focused on the sample 104. In some embodiments, the focal planes the first electron beam 114 and the second electron beam 116 are modified such that one of the beams is focused at a plane at or near the sample 104 and the other electron beam is focused at a plane which is located at least 0.1%, 1%, 10%, or 100% of the objective lens focal distance above or below the sample 104. Alternatively or in addition, the focal planes the first electron beam 114 and the second electron beam 116 may be modified such that the diameter of one of the electron beams at the sample 104 is at least one of 50, 100, 500, or 1000 times greater than the diameter of the other electron beam at the sample.

Examples of inventive subject matter according to the present disclosure are described in the following enumerated paragraphs.

A1. A method for investigating a sample, the method comprising emitting a plurality of charged particles toward the sample; forming the plurality of charged particles into a first charged particle beam and a second charged particle beam; modifying the focal properties of at least one of the first charged particle beam and the second charged particle beam.

A1.1. The method of paragraph A1, wherein modifying the focal properties of at least one of the first charged particle beam and the second charged particle beam comprises modifying one or more of the first charged particle beam and the second charged particle beams such that: the first charged particle beam has a first focal plane; and the second charged particle beam has a second focal plane that is different from the first focal plane.

A1.1.1. The method of paragraph A1.1, wherein modifying the focal properties of at least one of the first charged particle beam and the second charged particle beam comprises modifying one or more of the first charged particle beam and the second charged particle beams such that: the first charged particle beam has a focal plane at a plane at or near the sample; and the second charged particle beam does not have a focal plane at the plane at or near the sample.

A1.1.2. The method of paragraph A1.1, wherein modifying the focal properties of at least one of the first charged particle beam and the second charged particle beam comprises modifying one or more of the first charged particle beam and the second charged particle beams such that: the second charged particle beam has a focal plane at a plane at or near the sample; and the first charged particle beam does not have a focal plane at the plane at or near the sample.

A1.2. The method of any of paragraphs A1-A1.1.2, wherein modifying the focal properties of at least one of the first charged particle beam and the second charged particle beam comprises applying a round lens action to one of the first charged particle beam and the second charged particle beam.

A1.2.1. The method of paragraph A1.2, wherein modifying the focal properties of at least one of the first charged particle beam and the second charged particle beam comprises applying the round lens action to both of the first charged particle beam and the second charged particle beam.

A1.2.1.1. The method of paragraph A1.2.1, wherein the round lens action applied to the first charged particle beam is different from the round lens action applied to the second charged particle beam.

A1.3. The method of any of paragraphs A1-A1.2.1.1, wherein modifying the focal properties of at least one of the first charged particle beam and the second charged particle beam comprises applying at least a quadrupole lens action to one of the first charged particle beam and the second charged particle beam.

A1.4. The method of any of paragraphs A1-A1.3, wherein the first charged particle beam is an axial beam that travels along on an emission axis of the plurality of charged particles, and the second charged particle beam is a non-axial beam.

A1.5. The method of any of paragraphs A1-A1.4, wherein the second charged particle beam is an axial beam that travels along on an emission axis of the plurality of charged particles, and the first charged particle beam is a non-axial beam.

A2. The method of any of paragraphs A1-A1.5, wherein the charged particles are electrons and the charged particle beams are electron beams.

A3. The method of any of paragraphs A1-A2, wherein a second beam diameter of the second charged particle beam at the sample is at least one of 5, 10, 20, 50, 100, 500, or 1000 times greater than a first beam diameter of the first charged particle beam at the sample.

A3.1. The method of paragraph A3, wherein the second beam diameter is at least one of 5, 10, 20, 50, 100, 500, or 1000 times greater than a first beam diameter at or proximate to each crossover point of the first charged particle beam.

A4. The method of any of paragraphs A1-A3.1, wherein the first charged particle beam is tilted with respect to the second charged particle beam at the sample.

A5. The method of any of paragraphs A1-A4, wherein the first charged particle beam and the second charged particle beam are coherent beams.

A6. The method of any of paragraphs A1-A5, further comprising accelerating each of the first charged particle beam and the second charged particle beam to a final energy with an accelerator.

A7. The method of any of paragraphs A1-A5, further comprising accelerating the plurality of charged particles to a final energy with an accelerator.

A8. The method of any of paragraphs A1-A7, wherein each of the forming the plurality of charged particles and the modifying of the focal properties is performed by a bifocal beamformer.

A8.1. The method of paragraph A8 when dependent from A6, wherein the bifocal beamformer is located above an accelerator.

A8.2. The method of paragraph A8 when dependent from A7, wherein the bifocal beamformer is located below an accelerator.

A8.3. The method of any of paragraphs A8-A8.2, wherein the bifocal beamformer distorts the second charged particle beam.

A8.4. The method of any of paragraphs A8-A8.3, wherein the bifocal beamformer changes the focal planes of the second charged particle beam.

A8.5. The method of any of paragraphs A8-A8.4, wherein the bifocal beamformer causes the second charged particle beam to not be a cylindrically symmetric beam.

A8.5.1. The method of paragraph A8.5, further comprising causing the second charged particle beam to be a cylindrically symmetric beam with a stigmator.

A8.6. The method of any of A8-A8.5.1, wherein the bifocal beamformer causes the second charged particle beam to have one or more aberrations.

A8.6.1. The method of paragraphs A8.6, wherein at least one of the one or more aberrations is a deterministic aberration.

A8.6.2. The method of any of paragraphs A8.6-8.6.1, wherein the bifocal beamformer is positioned and/or configured to cause at least one of the one or more aberrations to correct another aberration in the system.

A8.7. The method of any of paragraphs A8-A8.6.2, wherein the bifocal beamformer is further configured to deflect at least one of the first charged particle beam and the second charged particle beam away from an emission axis of the plurality of charged particles.

A9. The method of any of paragraphs A8-A8.7, wherein the bifocal beamformer comprises a MEMS device configured to generate at least a quadrupole lensing effect that at least partially causes the modifying of the focal properties of at least one of the first charged particle beam and the second charged particle beam.

A9.1. The method of paragraph A9, wherein the MEMS device comprises a structure defining a first aperture and a second aperture, and wherein the first charged particle beam passes through the first aperture and the second charged particle beam passes through the second aperture.

A9.1.1. The method of paragraph A9.1, wherein the first aperture has the same radius as the second aperture.

A9.1.2. The method of paragraph A9.1, wherein the first aperture has a smaller radius than the second aperture.

A9.1.3. The method of paragraph A9.1, wherein the first aperture has a greater radius than the second aperture.

A9.1.4. The method of any of paragraphs A9.1-A9.1.3, wherein the MEMS device comprises a surface layer facing the plurality of charged particles, and wherein the first aperture and the second aperture are defined by the surface layer.

A9.1.4.1. The method of paragraph A9.1.4, wherein the surface layer is a foil.

A9.1.5. The method of any of paragraphs A9.1-A9.1.4.1, wherein the first aperture is an axial aperture positioned on an emission axis of the plurality of charged particles, and the second aperture is a non-axial aperture.

A9.1.6. The method of any of paragraphs A9.1-A9.1.4.1, wherein the second aperture is an axial aperture positioned on an emission axis of the plurality of charged particles, and the first aperture is a non-axial aperture.

A9.2. The method of any of paragraphs A9-A9.1.5, wherein the MEMS device comprises one or more electrodes.

A9.2.1. The method of paragraph A9.2, wherein when corresponding voltages are applied to the one or more electrodes, the one or more electrode generates an electromagnetic field that at least partially applies the at least the quadrupole lensing effect.

A9.2.1. The method of any of paragraphs A9.2-A9.2.1, wherein at least one of the one or more electrodes is grounded.

A9.2.2. The method of any of paragraphs A9.2-A9.2.1 when dependent from A9.1.4, wherein the MEMS device comprises an insulating layer that is opposite the surface layer.

A9.2.2.1. The method of paragraph A9.2.2, wherein the one or more electrodes are located in an electrode layer positioned between the insulating layer and the surface layer.

A9.2.3. The method of any of paragraphs A9.2-A9.2.2.1 wherein the one or more electrodes comprise four electrodes.

A9.2.4. The method of any of paragraphs A9.2-A9.2.2.1 wherein the one or more electrodes comprise seven electrodes.

A9.3. The method of any of paragraphs A9-A9.2.4, wherein the at least the quadrupole lensing effect is one of a dipole lensing effect, quadrupole lensing effect, hexapole lensing effect, and a octupole lensing effect.

A9.4. The method of any of paragraphs A9-A9.3, wherein the at least the quadrupole field does not cause the focal plane of the first charged particle beam to be changed.

A9.5. The method of any of paragraphs A9-A9.4, wherein the MEMS device is further configured to generate one or more dipole fields.

A9.5.1. The method of paragraph A9.5, wherein the one or more dipole fields cause at least one of the charged particle beams to be deflected in a direction perpendicular to the emission axis.

A9.6. The method of any of paragraphs A9-A9.5.1, wherein the quadrupole lensing effect applies: a positive lens effect to the first charged particle beam in a first meridional plane of the first charged particle beam; and a negative lensing effect to the first charged particle beam in a second meridional plane of the first charged particle beam, wherein the first meridional plane is perpendicular to the second meridional plane.

A9.6.1. The method of paragraph A9.6, wherein a first change of the focal plane of the first charged particle beam in the first meridional plane caused by the quadrupole field is different than a second change of the focal plane of the first charged particle beam in the second meridional plane caused by the quadrupole field.

A9.7. The method of any of paragraphs A9-A9.5.1, wherein the quadrupole lensing effect applies: a positive lens effect to the second charged particle beam in a first meridional plane of the second charged particle beam; and a negative lensing effect to the second charged particle beam in a second meridional plane of the second charged particle beam, wherein the first meridional plane is perpendicular to the second meridional plane.

A9.7.1. The method of paragraph A9.7, wherein a first change of the focal plane of the second charged particle beam in the first meridional plane caused by the quadrupole field is different than a second change of the focal plane of the second charged particle beam in the second meridional plane caused by the quadrupole field.

A10. The method of any of paragraphs A8-A8.6.2, wherein the bifocal beamformer comprises: a physical structure defining a first aperture and a second aperture, wherein the first charged particle beam passes through the first aperture and the second charged particle beam passes through the second aperture; and a lens positioned and/or configured to adjust the focal properties of the at least one of the first charged particle beam and the second charged particle beam such that they have different focal planes.

A10.1. The method of paragraph A10, wherein the first charged particle beam passes through the first aperture and the second charged particle beam passes through the second aperture.

A10.2. The method of any of paragraphs A10-A10.1, wherein the lens is an einzel lens.

A10.3. The method of any of paragraphs A10-A10.2, wherein the lens is positioned above the physical structure.

A10.4. The method of any of paragraphs A10-A10.2, wherein the lens is positioned below above the physical structure.

A10.5. The method of any of paragraphs A10-A10.4, wherein the lens is positioned and/or configured to adjust the focal properties of the second charged particle beam.

A10.5.1. The method of paragraph A10.5, wherein the lens is not positioned and/or configured to adjust the focal planes of the first charged particle beam.

A11. The method of any of paragraphs A6-A6.5, wherein the bifocal beamformer comprises at least one physical structure that defines: a first aperture that allows the first charged particle beam to pass through the at least one physical structure; a second aperture that allows the second charged particle beam to pass through the at least one physical structure; and plurality of other apertures.

A11.1. The method of paragraph A11, wherein the first aperture, the second aperture, and the plurality of other apertures form a pattern that creates an electromagnetic field that applies a lensing effect to the second charged particle beam during use of the bifocal beamformer.

A11.1.1. The method of paragraph A11.1, wherein the first aperture, the second aperture, and the plurality of other apertures form a pattern that creates an electromagnetic field that applies at least a quadrupole lensing effect to the second charged particle beam during use of the bifocal beamformer.

A11.1.1.1. The method of paragraph A11.1.1, wherein the electromagnetic field does not apply the quadrupole lensing effect to the first charged particle beam during use of the bifocal beamformer.

A11.1.2. The method of any of paragraphs A11.1-A11.1.1.1, wherein the first aperture, the second aperture, and the plurality of other apertures form a pattern that creates an electromagnetic field that applies a circular lensing effect to the first charged particle beam during use of the bifocal beamformer.

A11.1.2.1. The method of paragraph A11.1.2, wherein the plurality of other apertures form a pattern that creates an electromagnetic field that applies at least a circular lensing effect to the second charged particle beam during use of the bifocal beamformer.

A11.1.3. The method of any of paragraphs A11.1-A11.2.1, wherein the lensing effect applied by the electromagnetic field at least partially causes the modifying of the focal properties of at least one of the first charged particle beam and the second charged particle beam.

A11.1.3.1. The method of paragraph A11.1.3, wherein the electromagnetic field does change the focal planes of the first charged particle beam.

A11.3. The method of any of paragraphs A11-A11.2.1, wherein at least one aperture of the plurality of apertures is a hole.

A11.3.1. The method of paragraph A11.3, wherein the hole comprises:

an entrance defined in a first surface of the at least one physical structure, the first surface facing the plurality of charged particles; an exit defined in a second surface of the at least one physical structure that is opposite the first surface; and an empty volume that connects the entrance and the exit.

A11.3.1.1. The method of paragraph A11.3.1, wherein the first surface and the second surface are each surfaces of a single physical structure.

A11.3.1.2. The method of paragraph A11.3.1, wherein the first surface and the second surface are each surfaces of a different physical structures.

A11.4. The method of any of paragraphs A11-A11.3.1.2, wherein at least one aperture of the plurality of apertures is a cavity.

A11.4.1. The method of paragraph A11.4, wherein the cavity comprises: an entrance defined in a first surface of the at least one physical structure, the first surface facing the plurality of charged particles; and an empty volume in communication with the entrance and defined by the at least one physical structure, wherein the at least one physical structure defines the empty volume such that a charged particle of the plurality of charged particles that enters the empty volume via the entrance does not pass through the bifocal beamformer.

A11.4.1.1. The method of paragraph A11.4.1, wherein the cavity is defined by a single physical structure.

A11.4.1.2. The method of paragraph A11.4.1, wherein the cavity is defined by multiple physical structures.

A11.5. The method of any of paragraphs A11.3-A11.4.1.2, wherein the plurality of apertures comprises a combination of holes and cavities.

A11.6. The method of any of paragraphs A11-A11.5, wherein the geometry of at least one of the first aperture, the second aperture, or an aperture of the plurality of apertures is circular.

A11.7. The method of any of paragraphs A11-A11.5, wherein the geometry of at least one of the first aperture, the second aperture, or an aperture of the plurality of apertures is rectangular.

A11.7.1. The method of any of paragraphs A11-A11.5, wherein the geometry of at least one of the first aperture, the second aperture, or an aperture of the plurality of apertures is a square.

A11.7.2. The method of any of paragraphs A11-A11.5, wherein the geometry of at least one of the first aperture, the second aperture, or an aperture of the plurality of apertures has rounded corners.

A11.8. The method of any of paragraphs A11-A11.7.2, wherein the geometries of the first aperture, the second aperture, and the plurality of apertures is not uniform.

A11.9. The method of any of paragraphs A11-A11.8, wherein the sizes of the first aperture, the second aperture, and the plurality of apertures is not uniform.

A11.10. The method of any of paragraphs A11-A11.9, wherein the bifocal beamformer further comprises a first electrode configured to receive a first applied voltage.

A11.10.1. The method of paragraph A11.10, wherein the first electrode comprises a physical structure that at least partially defines an electrode entrance aperture that allows at least a portion of the plurality of charged particles to pass through the first electrode.

A11.10.1.1. The method of paragraph A11.10.1, wherein the electrode entrance aperture is a first electrode entrance aperture that allows a first portion of the plurality of charged particles to pass through the first electrode, and the second electrode further defines a second electrode entrance aperture that allows a second portion of the plurality of charged particles to pass through the first electrode.

A11.10.2. The method of any of paragraphs A11.10-A11.10.1.1, wherein the first electrode is upstream of the first aperture, the second aperture, and the plurality of apertures.

A11.10.3. The method of any of paragraphs A11.10-A11.10.2, wherein the first electrode is a disk shaped electrode.

A11.10.4. The method of any of paragraphs A11.10-A11.10.2, wherein the bifocal beamformer further comprises a second electrode configured to receive a second applied voltage.

A11.10.4.1. The method of paragraph A11.10.4, wherein the first voltage is different from the second voltage.

A11.10.4.2. The method of paragraph A11.10.4, wherein the first voltage and the second voltage are different.

A11.10.4.3. The method of any of paragraphs A11.10.4-A11.10.4.2, wherein the second electrode comprises a physical structure that at least partially defines an electrode exit aperture that at least one of the first charged particle beam and the second charged particle beam to pass through the second electrode.

A11.10.4.3.1. The method of paragraph A11.10.4.3, wherein the electrode exit aperture is a first electrode exit aperture that allows the first charged particle beam to pass through the second electrode, and the second electrode further comprises a second electrode exit aperture that allows the second charged particle beam to pass through the second electrode.

A11.10.4.3. The method of any of paragraphs A11.10.4-A11.10.4.3.1, wherein the second electrode is positioned downstream of the first aperture, the second aperture, and the plurality of apertures.

A12. The method of any of paragraphs A8-A8.6.2, wherein the bifocal beamformer comprises a biprism that defines a hole, and which is positioned and/or configured to split the plurality of charged particles into the first charged particle beam and the second charged particle beam.

A13. The method of any of paragraphs A8-A8.6.2, wherein laser pattern fringes are used to split the plurality of charged particles into the first charged particle beam and the second charged particle beam.

A14. The method of any of paragraphs A1-A13, wherein the second charged particle beam is focused at a different plane located above the sample.

A13.1. The method of paragraph A13, wherein the different plane is located at least 0.1%, 1%, 10%, or 100% of the objective lens focal distance above the sample.

A14. The method of any of paragraphs A1-A13, wherein the second charged particle beam is focused at a different plane located below the sample.

A14.1. The method of paragraph A14, wherein the different plane is located at least at least 0.1%, 1%, 10%, or 100% of the objective lens focal distance below the sample.

A15. The method of any of paragraphs A13-A14.1, wherein the distance between the plane at or near the sample and the different plane is at least 0.1%, 1%, 10%, or 100% of the objective lens focal distance.

A16. The method of any of paragraphs A1-A15, wherein the second charged particle beam is a parallel beam at the sample.

B1. A method for using electron holography to investigate a sample, the method comprising emitting a plurality of electrons toward the sample; forming the plurality of electrons into a first electron beam and a second electron beam; modifying the focal properties of at least one of the first electron beam and the second electron beam such that the two electron beams have different focal planes; focusing the first electron beam such that it has a focal plane at or near the sample; focusing the second electron beam so that it is incident on the sample, and has a focal plane in the diffraction plane; and detecting an interference pattern of the first electron beam and the diffracted second electron beam in the diffraction plane.

B1.1. The method of paragraph B1, further comprising generating a hologram image of the sample based on the interference pattern of the first electron beam and the diffracted second electron beam in the diffraction plane.

B1.2. The method of any of paragraphs B1-B1.1, further comprising determining the phase of electrons diffracted by the sample based on the interference pattern of the first electron beam and the diffracted second electron beam in the diffraction plane.

B1.3. The method of any of paragraphs B1-B1.2, further comprising determining the exit wave function of the electrons leaving the sample in response to the second electron beam being incident on the sample.

B1.3.1. The method of paragraph B1.3, where determining the exit wave function comprises determining the phase and amplitude of the exit wave function of the electrons leaving the sample in response to the second electron beam being incident on the sample.

B1.3.2. The method of any of paragraphs B1.3-B1.3.1, further comprising determining the structure of the sample based on the exit wave function.

B1.3.2.1. The method of paragraph B1.3.2, wherein the sample is a crystal, and determining the structure of the sample comprises determining the crystal lattice of the sample based on the exit wave function.

B2. The method of any of paragraphs B1-B1.3.2.1, wherein one of the first electron beam and the second electron beam is an axial beam that travels along an emission axis of the plurality of charged particles.

B3. The method of any of paragraphs B1-B2, wherein the diffraction plane corresponds to the first focal plane of the second electron beam downstream of the sample.

B4. The method of any of paragraphs B1-B3, wherein the first electron beam and the second electron beam are coherent.

B4. The method of any of paragraphs B1-B3, wherein the first electron plane passes through an aperture in the sample.

B4.1. The method of paragraph B4, wherein the method further comprises, burning the aperture in the sample with one of an electron beam and an ion beam.

B5. The method of any of paragraphs B1-B3, wherein the first electron beam passes through a thin region of the sample such that there is insufficient scattering to disturb the first electron beam.

B6. The method of any of paragraphs B1-B5, wherein the second electron beam is a parallel beam at the sample.

B7. The method of any of paragraphs B1-B6, wherein a second diameter of the second electron beam is greater than 5, 10, 20, 50, and 100 times larger than a first diameter of the first electron beam.

B8. The method of any of paragraphs B1-B7, wherein the first charged particle beam is an axial beam that travels along an emission axis of the plurality of charged particles, and the second charged particle beam is a non-axial beam.

B9. The method of any of paragraphs B1-B7, wherein the second charged particle beam is an axial beam that travels along on an emission axis of the plurality of charged particles, and the first charged particle beam is a non-axial beam.

B10. The method of any of paragraphs B1-B9, wherein modifying the focal properties of at least one of the first electron beam and the second electron beam comprises applying a round lens action to one of the first electron beam and the second electron beam.

B10.1. The method of paragraph B10, wherein modifying the focal properties of at least one of the first electron beam and the second electron beam comprises applying the round lens action to both of the first electron beam and the electron particle beam.

B10.1.1. The method of paragraph B10.1, wherein the round lens action applied to the first electron beam is different from the round lens action applied to the second electron beam.

B11. The method of any of paragraphs B1-B10.1.1, wherein modifying the focal properties of at least one of the first electron beam and the second electron beam comprises applying at least a quadrupole lens action to one of the first electron beam and the second electron beam.

B11.1. The method of paragraph B11, wherein the at least a quadrupole lens action applies an astigmatism to the one of the first electron beam and the second electron beam such that it is no longer a cylindrically symmetric beam.

B11.2. The method of any of paragraphs B11-B11.1, wherein the method further comprises, applying an additional at least a quadrupole lensing effect to the one of the first electron beam and the second electron beam.

B11.2.1. The method of paragraph B11.2, wherein the additional at least a quadrupole lensing effect causes the one of the first electron beam and the second electron beam to be a cylindrically symmetric beam.

B11.2.2. The method of any of paragraphs B11.2-B11.2.1, wherein the at least a quadrupole lensing effect is applied by a corrector.

B11.2.2.1. The method of paragraph B11.2.2, wherein the corrector further applies a deflection perpendicular to an emission axis of the plurality of electrons.

B11.2.2.1.1. The method of paragraph B11.2.2.1, wherein the second electron beam is an axial beam, and the deflection causes the second electron beam to be a non-axial beam downstream of the corrector.

B11.2.2.1.2. The method of paragraph B11.2.2.1, wherein the second electron beam is a non-axial beam, and the deflection causes the second electron beam to be an axial beam downstream of the corrector.

B11.2.2.1.3. The method of paragraph B11.2.2.1, wherein the first electron beam is an axial beam, and the deflection causes the first electron beam to be a non-axial beam downstream of the corrector.

B11.2.2.1.4. The method of paragraph B11.2.2.1, wherein the first electron beam is a non-axial beam, and the deflection causes the first electron beam to be an axial beam downstream of the corrector.

B11.2.2.2. The method of any of paragraphs B11.2.2.1-B11.2.2.1.4, wherein the corrector is positioned at a focal plane of the electron beam that did not receive the at least the quadrupole lensing effect.

B12. The method of any of paragraphs B1-B11.2.2.2, wherein the plurality of electrons are split and the first electron beam and the second electron beam are modified by a MEMS device.

B12.1. The method of paragraph B12, wherein the MEMS device comprises a MEMS device of any of paragraphs F1-F12.1.

B13. The method of any of paragraphs B1-B12, wherein the plurality of electrons are split and the first electron beam and the second electron beam are modified by a multi aperture device.

B13.1. The method of paragraph B13, wherein the MEMS device comprises a MEMS device of any of paragraphs F1-F12.1.

B14. The method of any of paragraphs B1-B13, wherein the sample is a crystal.

B14.1. The method of paragraph B14, wherein the diffraction peaks in the diffraction image are Airy disks.

B15. The method of any of paragraphs B1-B14.1, wherein the electrons scattered by the sample have a focal plane in the diffraction plane.

C1. A system for investigating a sample, the system comprising: a sample holder configured to hold a sample; a charged particle emitter configured to emit charged particles towards the sample; a bifocal beamformer positioned between the charged particle emitter and the sample holder, wherein the bifocal beamformer is configured to: form the plurality of charged particles into a first charged particle beam and a second charged particle beam; and modify the focal properties of at least one of the first charged particle beam and the second charged particle beam such that the first charged particle beam is focused at a plane at or near the sample and the second charged particle beam is not focused at the plane at or near the sample.

C2. The system of paragraph C1, wherein the charged particle emitter is an electron emitter configured to emit electrons toward the sample, and the charged particle beams are electron beams.

C3. The system of any of paragraphs C1-C2, wherein a second beam diameter of the second charged particle beam at the sample is at least one of 5, 10, 20, 50, 100, 500, or 1000 times greater than a first beam diameter of the first charged particle beam at the sample.

C3.1. The system of paragraph C3, wherein the second beam diameter is at least one of 5, 10, 20, 50, 100, 500, or 1000 times greater than a first beam diameter at or proximate to each crossover point of the first charged particle beam.

C4. The system of any of paragraphs C1-C3.1, wherein the first charged particle beam is tilted with respect to the second charged particle beam at the sample.

C5. The system of any of paragraphs C1-C4, wherein the first charged particle beam and the second charged particle beam are coherent beams.

C6. The system of any of paragraphs C1-C5, further comprising an accelerator.

C6.1. The system of paragraph C6, wherein the accelerator is positioned below the bifocal beamformer and configured to accelerate each of the first charged particle beam and the second charged particle beam to a final energy.

C6.2. The system of paragraph C6, wherein the accelerator is positioned above the bifocal beamformer and configured to accelerate the plurality of charged particles to a final energy.

C7. The system of any of paragraphs C1-C6.2, wherein the bifocal beamformer distorts the second charged particle beam.

C8. The system of any of paragraphs C1-C7, wherein the bifocal beamformer changes the focal planes of the second charged particle beam.

C9. The system of any of paragraphs C8-C8.4, wherein the bifocal beamformer causes one of the first charged particle beam and the second charged particle beam to not be a cylindrically symmetric beam.

C9.1. The system of paragraph C9, further comprising a corrector configured to cause the second charged particle beam to be a cylindrically symmetric beam.

C9.1.1. The system of paragraph C9.1., wherein the corrector is a stigmator.

C10. The system of any of C1-C9.1.1, wherein the bifocal beamformer causes the second charged particle beam to have one or more aberrations.

C10.1. The system of paragraphs C10, wherein at least one of the one or more aberrations is a deterministic aberration.

C10.2. The system of any of paragraphs C10-C10.1, wherein the bifocal beamformer is positioned and/or configured to cause at least one of the one or more aberrations to correct another aberration in the system.

C11. The system of any of paragraphs C1-C10.2, wherein the bifocal beamformer is further configured to deflect at least one of the first charged particle beam and the second charged particle beam away from an emission axis of the plurality of charged particles.

C12. The system of any of paragraphs C1-C11, wherein the bifocal beamformer comprises a MEMS device configured to generate at least a quadrupole field that at least partially causes the modifying of the focal properties of at least one of the first charged particle beam and the second charged particle beam.

C12.1. The system of paragraph C12, wherein the MEMS device comprises a structure defining a first aperture and a second aperture, and wherein the first charged particle beam passes through the first aperture and the second charged particle beam passes through the second aperture.

C12.1.1. The system of paragraph C12.1, wherein the first aperture has the same radius as the second aperture.

C12.1.2. The system of paragraph C12.1, wherein the first aperture has a smaller radius than the second aperture.

C12.1.3. The system of paragraph C12.1, wherein the first aperture has a greater radius than the second aperture.

C12.1.4. The system of any of paragraphs C12.1-C12.1.3, wherein the MEMS device comprises a surface layer facing the plurality of charged particles, and wherein the first aperture and the second aperture are defined by the surface layer.

C12.1.4.1. The system of paragraph C12.1.4, wherein the surface layer is a foil.

C12.1.5. The system of any of paragraphs C12.1-C12.1.4.1, wherein the first aperture is an axial aperture positioned on an emission axis of the plurality of charged particles, and the second aperture is a non-axial aperture.

C12.1.6. The system of any of paragraphs C12.1-C12.1.4.1, wherein the second aperture is an axial aperture positioned on an emission axis of the plurality of charged particles, and the first aperture is a non-axial aperture.

C12.2. The system of any of paragraphs C12.1-C12.1.6, wherein the MEMS device comprises one or more electrodes.

C12.2.1. The system of paragraph C12.2, wherein when corresponding voltages are applied to the one or more electrodes, the one or more electrode generate the at least the quadrupole field.

C12.2.1. The system of any of paragraphs C12.2-12.2.1, wherein at least one of the one or more electrodes is grounded.

C12.2.2. The system of any of paragraphs C12.2-C12.2.1 when dependent from C12.1.4, wherein the MEMS device comprises an insulating layer that is opposite the surface layer.

C12.2.2.1. The system of paragraph C12.2.2, wherein the one or more electrodes are located in an electrode layer positioned between the insulating layer and the surface layer.

C12.2.3. The system of any of paragraphs C12.2-C12.2.2.1 wherein the one or more electrodes comprise four electrodes.

C12.2.4. The system of any of paragraphs C12.2-C12.2.2.1 wherein the one or more electrodes comprise seven electrodes.

C12.3. The system of any of paragraphs C12.1-C12.2.4, wherein the at least the quadrupole field is one of a dipole field, quadrupole field, hexapole field, or octupole field.

C12.4. The system of any of paragraphs C12.1-C12.3, wherein the at least the quadrupole field does not cause the focal planes of the first charged particle beam to be changed.

C12.5. The system of any of paragraphs C12.1-C12.4, wherein the MEMS device is further configured to generate one or more dipole fields.

C12.5.1. The system of paragraph C12.5, wherein the one or more dipole fields cause at least one of the charged particle beams to be deflected in a direction perpendicular to the emission axis.

C13. The system of any of paragraphs C1-C11, wherein the bifocal beamformer comprises: a physical structure defining a first aperture and a second aperture, wherein the first charged particle beam passes through the first aperture and the second charged particle beam passes through the second aperture; and a lens positioned and/or configured to adjust the focal properties of the at least one of the first charged particle beam and the second charged particle beam such that they have different focal planes.

C13.1. The system of paragraph C13, wherein the first charged particle beam passes through the first aperture and the second charged particle beam passes through the second aperture.

C13.2. The system of any of paragraphs C13-C13.1, wherein the lens is an einzel lens.

C13.3. The system of any of paragraphs C13-C13.2, wherein the lens is positioned above the physical structure.

C13.4. The system of any of paragraphs C13-C13.2, wherein the lens is positioned below above the physical structure.

C13.5. The system of any of paragraphs C13-C13.4, wherein the lens is positioned and/or configured to adjust the focal planes of the second charged particle beam.

C13.5.1. The system of paragraph C13.5, wherein the lens is not positioned and/or configured to adjust the focal planes of the first charged particle beam.

C14. The system of any of paragraphs C14-C14.5, wherein the bifocal beamformer comprises at least one physical structure that defines: a first aperture that allows the first charged particle beam to pass through the at least one physical structure; a second aperture that allows the second charged particle beam to pass through the at least one physical structure; and plurality of other apertures.

C14.1. The system of paragraph C14, wherein the plurality of other apertures form a pattern that creates an electromagnetic field that applies a lensing effect to the second charged particle beam during use of the bifocal beamformer.

C14.1.1. The system of paragraph C14.1, wherein the plurality of other apertures form a pattern that creates an electromagnetic field that applies at least a quadrupole lensing effect to the second charged particle beam during use of the bifocal beamformer.

C14.1.1.1. The system of paragraph C14.1.1, wherein the electromagnetic field does not apply the quadrupole lensing effect to the first charged particle beam during use of the bifocal beamformer.

C14.1.2. The system of any of paragraphs C14.1-C14.1.1.1, wherein the plurality of other apertures form a pattern that creates an electromagnetic field that applies a circular lensing effect to the first charged particle beam during use of the bifocal beamformer.

C14.1.2.1. The system of paragraph C14.1.2, wherein the plurality of other apertures form a pattern that creates an electromagnetic field that applies at least a circular lensing effect to the second charged particle beam during use of the bifocal beamformer.

C14.1.3. The system of any of paragraphs C14.1-C14.2.1, wherein the lensing effect applied by the electromagnetic field at least partially causes the modifying of the focal properties of at least one of the first charged particle beam and the second charged particle beam.

C14.1.3.1. The system of paragraph C14.1.3, wherein the electromagnetic field does change the focal planes of the first charged particle beam.

C14.3. The system of any of paragraphs C14-C14.2.1, wherein at least one aperture of the plurality of apertures is a hole.

C14.3.1. The system of paragraph C14.3, wherein the hole comprises:
an entrance defined in a first surface of the at least one physical structure, the first surface facing the plurality of charged particles; an exit defined in a second surface of the at least one physical structure that is opposite the first surface; and an empty volume that connects the entrance and the exit.

C14.3.1.1. The system of paragraph C14.3.1, wherein the first surface and the second surface are each surfaces of a single physical structure.

C14.3.1.2. The system of paragraph C14.3.1, wherein the first surface and the second surface are each surfaces of a different physical structures.

C14.4. The system of any of paragraphs C14-C14.3.1.2, wherein at least one aperture of the plurality of apertures is a cavity.

C14.4.1. The system of paragraph C14.4, wherein the cavity comprises:
an entrance defined in a first surface of the at least one physical structure, the first surface facing the plurality of charged particles; and an empty volume in communication with the entrance and defined by the at least one physical structure, wherein the at least one physical structure defines the empty volume such that a charged particle of the plurality of charged particles that enters the empty volume via the entrance does not pass through the bifocal beamformer.

C14.4.1.1. The system of paragraph C14.4.1, wherein the cavity is defined by a single physical structure.

C14.4.1.2. The system of paragraph C14.4.1, wherein the cavity is defined by multiple physical structures.

C14.5. The system of any of paragraphs C14.3-C14.4.1.2, wherein the plurality of apertures comprises a combination of holes and cavities.

C14.6. The system of any of paragraphs C14-C14.5, wherein the geometry of at least one of the first aperture, the second aperture, or an aperture of the plurality of apertures is circular.

C14.7. The system of any of paragraphs C14-C14.5, wherein the geometry of at least one of the first aperture, the second aperture, or an aperture of the plurality of apertures is rectangular.

C14.7.1. The system of any of paragraphs C14-C14.5, wherein the geometry of at least one of the first aperture, the second aperture, or an aperture of the plurality of apertures is a square.

C14.7.2. The system of any of paragraphs C14-C14.5, wherein the geometry of at least one of the first aperture, the second aperture, or an aperture of the plurality of apertures has rounded corners.

C14.8. The system of any of paragraphs C14-C14.7.2, wherein the geometries of the first aperture, the second aperture, and the plurality of apertures is not uniform.

C14.9. The system of any of paragraphs C14-C14.8, wherein the sizes of the first aperture, the second aperture, and the plurality of apertures is not uniform.

C14.10. The system of any of paragraphs C14-C14.9, wherein the bifocal beamformer further comprises a first electrode configured to receive a first applied voltage.

C14.10.1. The system of paragraph C14.10, wherein the first electrode comprises a physical structure that at least partially defines an electrode entrance aperture that allows at least a portion of the plurality of charged particles to pass through the first electrode.

C14.10.1.1. The system of paragraph C14.10.1, wherein the electrode entrance aperture is a first electrode entrance aperture that allows a first portion of the plurality of charged particles to pass through the first electrode, and the second electrode further defines a second electrode entrance aperture that allows a second portion of the plurality of charged particles to pass through the first electrode.

C14.10.2. The system of any of paragraphs C14.10-C14.10.1.1, wherein the first electrode is upstream of the first aperture, the second aperture, and the plurality of apertures.

C14.10.3. The system of any of paragraphs C14.10-C14.10.2, wherein the first electrode is a disk shaped electrode.

C14.10.4. The system of any of paragraphs C14.10-C14.10.2, wherein the bifocal beamformer further comprises a second electrode configured to receive a second applied voltage.

C14.10.4.1. The system of paragraph C14.10.4, wherein the first voltage is different from the second voltage.

C14.10.4.2. The system of paragraph C14.10.4, wherein the first voltage and the second voltage are different.

C14.10.4.3. The system of any of paragraphs C14.10.4-C14.10.4.2, wherein the second electrode comprises a physical structure that at least partially defines an electrode exit aperture that at least one of the first charged particle beam and the second charged particle beam to pass through the second electrode.

C14.10.4.3.1. The system of paragraph C14.10.4.3, wherein the electrode exit aperture is a first electrode exit aperture that allows the first charged particle beam to pass through the second electrode, and the second electrode further comprises a second electrode exit aperture that allows the second charged particle beam to pass through the second electrode.

C14.10.4.3. The system of any of paragraphs C14.10.4-C14.10.4.3.1, wherein the second electrode is positioned downstream of the first aperture, the second aperture, and the plurality of apertures.

C15. The system of any of paragraphs C1-C11, wherein the bifocal beamformer comprises a biprism that defines a hole, and which is positioned and/or configured to split the plurality of charged particles into the first charged particle beam and the second charged particle beam.

C16. The system of any of paragraphs C1-C11, wherein laser pattern fringes are used to split the plurality of charged particles into the first charged particle beam and the second charged particle beam.

C17. The system of any of paragraphs C1-C16, wherein the second charged particle beam is focused at a different plane located above the sample.

C17.1. The system of paragraph C17, wherein the different plane is located at least at least 0.1%, 1%, 10%, or 100% of the objective lens focal distance above the sample.

C18. The system of any of paragraphs C1-C16, wherein the second charged particle beam is focused at a different plane located below the sample.

C18.1. The system of paragraph C18, wherein the different plane is located at least 0.1%, 1%, 10%, or 100% of the objective lens focal distance below the specimen the sample.

C19. The system of any of paragraphs C17-C18.1, wherein the distance between the plane at or near the sample and the different plane is at least 0.1%, 1%, 10%, or 100% of the objective lens focal distance.

C20. The system of any of paragraphs C1-C19, wherein the second charged particle beam is a parallel beam at the sample.

D1. Use of the system of any of paragraphs C1-C20 to perform any of the methods of paragraphs A1-A16, B1-B15, L1-L10.2, or M9.1.

E1. A non-transitory computer readable media comprising instructions that, when executed by one or more processing units, cause the system of any of paragraphs C1-C20 to perform any of the methods of paragraphs A1-A16, B1-B15, L1-L10.2, or M1-M9.1.

F1. A MEMS device, comprising: a physical structure that defines: a first aperture configured to allow a first portion of charged particles of a plurality of charged particles to pass through the MEMS device; and a second aperture configured to allow a second portion of charged particles of the plurality of charged particles to pass through the MEMS device; and one or more electrodes configured to, when corresponding voltages are applied to the one or more electrodes, generate at least a quadrupole field that at least partially causes a modification of the focal planes of at least one of the first portion of charged particles and the second portion of charged particles.

F1.1. The MEMS device of paragraph F1, wherein the plurality of charged particles form a source beam that is incident on the MEMS device.

F1.1.1. The MEMS device of any of paragraphs F1-F1.1, wherein the plurality of charged particles are a plurality of electrons.

F2. The MEMS device of any of paragraphs F1-F1.1.1, wherein the first aperture is configured to form the first portion of charged particles into a first charged particle beam and the second aperture is configured to form the second portion of charged particles into a second charged particle beam.

F2.1. The MEMS device of paragraph F2, wherein the first aperture has the same radius as the second aperture.

F2.2. The MEMS device of paragraph F2, wherein the first aperture has a smaller radius than the second aperture.

F2.3. The MEMS device of paragraph F2, wherein the first aperture has a greater radius than the second aperture.

F3. The MEMS device of any of paragraphs F1-F2.3, wherein the physical structure comprises a surface layer that defines the first aperture and the second aperture.

F3.1. The MEMS device of paragraph F3, wherein the surface layer prevents a third portion of charged particles from passing through the MEMS device.

F3.2. The MEMS device of any of paragraphs F3-F3.1, wherein the surface layer is a foil.

F4. The MEMS device of any of paragraphs F1-F3.2, wherein the first aperture is an axial aperture positioned on an emission axis of the plurality of charged particles, and the second aperture is a non-axial aperture.

F5. The MEMS device of any of paragraphs F1-F3.2, wherein the second aperture is an axial aperture positioned on an emission axis of the plurality of charged particles, and the first aperture is a non-axial aperture.

F6. The MEMS device of any of paragraphs F1-F5, wherein at least one of the one or more electrodes is grounded.

F7. The MEMS device of any of paragraphs F1-F6 when dependent from any of paragraphs F3-F3.1, wherein the MEMS device comprises an insulating layer that is opposite the surface layer.

F7.1. The MEMS device of paragraph F7, wherein the one or more electrodes are located in an electrode layer positioned between the insulating layer and the surface layer.

F8. The MEMS device of any of paragraphs F1-F7.1, wherein the one or more electrodes comprise four electrodes.

F9. The MEMS device of any of paragraphs F1-F7.1, wherein the one or more electrodes comprise seven electrodes.

F10. The MEMS device of any of paragraphs F1-F9, wherein the at least the quadrupole field is one of a dipole field, quadrupole field, hexapole field, or octupole field.

F11. The MEMS device of any of paragraphs F1-F10, wherein the at least the quadrupole field does not cause the focal planes of the first charged particle beam to be changed.

F12. The MEMS device of any of paragraphs F1-F11, wherein the MEMS device is further configured to generate one or more dipole fields.

F12.1. The MEMS device of paragraph F12, wherein the one or more dipole fields cause at least one of the charged particle beams to be deflected in a direction perpendicular to the emission axis.

G1. Use of any of the MEMS devices of any of paragraphs F1-F12.1.

G2. Use of any of the MEMS devices of paragraphs F1-F12.1 to perform any of the methods of paragraphs A1-A16, B1-B15, L1-L10.2, or M1-M9.1.

G3. The use of any of the MEMS devices of paragraphs F1-F12.1 for investigation of a sample.

H1. Use of any of the MEMS devices of paragraphs F1-F12.1 in a system of any of paragraphs C1-C20.

I1. An aperture lens array device comprising: at least one physical structure that defines: a first aperture configured to allow a first portion of charged particles of a plurality of charged particles to pass through the aperture lens array device; a second aperture configured to allow a second portion of charged particles of the plurality of charged particles to pass through the aperture lens array device; plurality of other apertures; and at least one electrode, wherein the first aperture, the second aperture, and the plurality of other apertures form a pattern that, when corresponding voltages are applied to the at least one physical structure and at least one electrode, produces an electromagnetic field that applies a lensing effect to the second portion of charged particles during use of the aperture lens array device.

I1.1. The aperture lens array device of paragraph I1, wherein the plurality of charged particles form a source beam that is incident on the aperture lens array device.

I1.1.1. The aperture lens array device of any of paragraphs I1-I1.1, wherein the plurality of charged particles are a plurality of electrons.

I2. The aperture lens array device of any of paragraphs I.1-I1.1.1, wherein the first aperture is configured to form the first portion of charged particles into a first charged particle beam and the second aperture is configured to form the second portion of charged particles into a second charged particle beam.

I2.1. The aperture lens array device of paragraphs I2, wherein the electromagnetic field applies at least a quadrupole lensing effect to the second charged particle beam during use of the aperture lens array device.

I2.1.1. The aperture lens array device of paragraph I2.1, wherein the electromagnetic field does not apply the quadrupole lensing effect to the first charged particle beam during use of the aperture lens array device.

I2.1.2. The aperture lens array device of any of paragraphs I2-I2.1.1, wherein the electromagnetic field applies a circular lensing effect to the first charged particle beam during use of the aperture lens array device.

I2.1.3. The aperture lens array device of any of paragraphs I2-I2.1.2, wherein the electromagnetic field that at least a circular lensing effect to the second charged particle beam during use of the aperture lens array device.

I3. The aperture lens array device of any of paragraphs I1-I2.1.3, wherein the lensing effect applied by the electromagnetic field at least partially causes a modification of the focal planes of at least one of the first charged particle beam and the second charged particle beam.

I3.1. The aperture lens array device of paragraph I1, wherein the modification of the focal planes caused by the lensing effect causes the first charged particle beam and the second charged particle beam to have different focal planes.

I3.2. The aperture lens array device of any of paragraphs I3-I3.1, wherein the electromagnetic field does change the focal planes of the first charged particle beam.

I4. The aperture lens array device of any of paragraphs I1-I3.2, wherein at least one aperture of the plurality of apertures is a hole.

I4.1. The aperture lens array device of paragraph I4, wherein the hole comprises: an entrance defined in a first surface of the at least one physical structure, the first surface facing the plurality of charged particles; an exit defined in a second surface of the at least one physical structure that is opposite the first surface; and an empty volume that connects the entrance and the exit.

I4.1.1. The aperture lens array device of paragraph I4.1, wherein the first surface and the second surface are each surfaces of a single physical structure.

I4.1.2. The aperture lens array device of paragraph I4.1, wherein the first surface and the second surface are each surfaces of a different physical structures.

I5. The aperture lens array device of any of paragraphs I1-I4.1.2, wherein at least one aperture of the plurality of apertures is a cavity.

I5.1. The aperture lens array device of paragraph I5, wherein the cavity comprises: an entrance defined in a first surface of the at least one physical structure, the first surface facing the plurality of charged particles; and an empty volume in communication with the entrance and defined by the at least one physical structure, wherein the at least one physical structure defines the empty volume such that a charged particle of the plurality of charged particles that enters the empty volume via the entrance does not pass through the bifocal beamformer.

I5.1. The aperture lens array device of paragraph I5.1, wherein the cavity is defined by a single physical structure.

I5.2. The aperture lens array device of paragraph I5.1, wherein the cavity is defined by multiple physical structures.

I6. The aperture lens array device of any of paragraphs I4-I5.2, wherein the plurality of apertures comprises a combination of holes and cavities.

I7. The aperture lens array device of any of paragraphs I1-I6, wherein the geometry of at least one of the first aperture, the second aperture, or an aperture of the plurality of apertures is circular.

I8. The aperture lens array device of any of paragraphs I1-I7, wherein the geometry of at least one of the first aperture, the second aperture, or an aperture of the plurality of apertures is rectangular.

I9. The aperture lens array device of any of paragraphs I1-I8, wherein the geometry of at least one of the first aperture, the second aperture, or an aperture of the plurality of apertures is a square.

I10. The aperture lens array device of any of paragraphs I1-I9, wherein the geometry of at least one of the first aperture, the second aperture, or an aperture of the plurality of apertures has rounded corners.

I11. The aperture lens array device of any of paragraphs I1-I10, wherein the geometries of the first aperture, the second aperture, and the plurality of apertures is not uniform.

I12. The aperture lens array device of any of paragraphs I1-I11, wherein the sizes of the first aperture, the second aperture, and the plurality of apertures is not uniform.

I13. The aperture lens array device of any of paragraphs I1-I12, wherein the at least one electrode comprises a first electrode configured to receive a first applied voltage.

I13.1. The aperture lens array device of paragraph I13, wherein the first electrode comprises a physical structure that at least partially defines an electrode entrance aperture that allows at least a portion of the plurality of charged particles to pass through the first electrode.

I13.1.1. The aperture lens array device of paragraph I13.1, wherein the electrode entrance aperture is a first electrode entrance aperture that allows a first portion of the plurality of charged particles to pass through the first electrode, and the second electrode further defines a second electrode entrance aperture that allows a second portion of the plurality of charged particles to pass through the first electrode.

I13.2. The aperture lens array device of any of paragraphs I13-I13.1.1, wherein the first electrode is upstream of the first aperture, the second aperture, and the plurality of apertures.

I13.3. The aperture lens array device of any of paragraphs I13-I13.2, wherein the first electrode is a disk shaped electrode.

I13.4. The aperture lens array device of any of paragraphs I13-I13.3, wherein the at least one electrode further comprises a second electrode configured to receive a second applied voltage.

I13.4.1. The aperture lens array device of paragraph I13.4, wherein the first voltage is different from the second voltage.

I13.4.2. The aperture lens array device of paragraph I13.4, wherein the first voltage and the second voltage are the same.

I13.4.3. The aperture lens array device of any of paragraphs I13.4-I13.4.2, wherein the second electrode comprises a physical structure that at least partially defines an electrode exit aperture that at least one of the first charged particle beam and the second charged particle beam to pass through the second electrode.

I13.4.3.1. The aperture lens array device of paragraph I13.4.3, wherein the electrode exit aperture is a first electrode exit aperture that allows the first charged particle beam to pass through the second electrode, and the second electrode further comprises a second electrode exit aperture that allows the second charged particle beam to pass through the second electrode.

I13.4.4. The aperture lens array device of any of paragraphs I13.4-I13.4.3.1, wherein the second electrode is positioned downstream of the first aperture, the second aperture, and the plurality of apertures.

J1. Use of the multi-aperture device of any of paragraphs I1-I13.4.4.

J2. Use of the multi-aperture device of any of paragraphs I1-I13.4.4 to perform any of the methods of paragraphs A1-A16, B1-B15, L1-L10.2, or M9.1.

J3. The use of the multi-aperture device of any of paragraphs I1-I13.4.4 for investigation of a sample.

K1. Use of the multi-aperture device of any of paragraphs I1-I13.4.4 in a system of any of paragraphs C1-C20.

L1. A method for investigating a sample with TEM and STEM techniques, the method comprising: emitting a plurality of electrons toward a sample; forming the plurality of electrons particles into a first electron beam and a second electron beam; modifying the focal properties of at least one of the first electron beam and the second electron beam such that: the first electron beam a STEM beam that is focused at a plane at or near the sample; and the second electron beam is a TEM beam that is incident on the sample; detecting emissions resultant from the STEM beam and the TEM beam being incident on the sample.

L1.1. The method of paragraph L1, wherein the TEM beam is a parallel beam when incident on the sample.

L1.2. The method of paragraph L1, wherein the TEM beam is a convergent beam when incident on the sample.

L1.3. The method of paragraph L1, wherein the TEM beam is a divergent beam when incident on the sample.

L2. The method of any of paragraph L1-L1.3, further comprising generating one or both of a STEM image and TEM image from the detected emissions resultant from the STEM beam and the TEM beam being incident on the sample.

L3. The method of any of paragraph L1-L2, wherein detecting emissions resultant from the STEM beam and the TEM beam being incident on the sample comprises detecting (1) emissions resultant from the STEM beam being incident and (2) emissions resultant from the TEM beam being incident on the sample, using a same detector and/or detector array.

L4. The method of any of paragraph L1-L3, wherein detecting emissions resultant from the STEM beam and the TEM beam being incident on the sample comprises detecting (1) emissions resultant from the STEM beam being incident and (2) emissions resultant from the TEM beam being incident on the sample, at the same time.

L4.1. The method of paragraph L4, further comprising scanning the STEM beam across a surface region of the sample.

L4.1.1. The method of paragraph L4.1, wherein the TEM beam remains incident on the sample while the STEM beam is scanned.

L4.1.2. The method of any of paragraphs L4.1-L4.1.1, wherein the TEM beam remains incident on a static location while the STEM beam is scanned.

L5. The method of any of paragraph L1-L4.1, further comprising switching between two of a STEM mode of operation, a TEM mode of operation, and a simultaneous STEM/TEM mode of operation.

L5.1. The method of paragraph L5, wherein switching to the STEM mode of operation comprises causing the TEM beam to be blocked so that only the STEM beam is incident on the sample.

L5.1.1. The method of paragraph 5.1, wherein causing the TEM beam to be blocked comprises one of: deflecting the TEM beam so that it is blocked by a beam blocker; moving a beam blocker such that the beam blocker obstructs the path of the TEM beam; and obstructing an aperture so that the TEM beam cannot pass through the aperture.

L5.2. The method of any of paragraph L5-L5.1, wherein switching to the TEM mode of operation comprises causing the STEM beam to be blocked so that only the TEM beam is incident on the sample.

L5.2.1. The method of paragraph 5.2, wherein causing the STEM beam to be blocked comprises one of: deflecting the STEM beam so that it is blocked by a beam blocker; moving a beam blocker such that the beam blocker obstructs the path of the STEM beam; and obstructing an aperture so that the STEM beam cannot pass through the aperture.

L6. The method of any of paragraphs L1-L5.2.1., further comprising determining a portion of the detected emissions that is attributable to the TEM beam being incident on the sample.

L6.1. The method of paragraph L6, further comprising determining a portion of the detected emissions that is attributable to the STEM beam being incident on the sample.

L7. The method of any of paragraphs L1-L6.1, further comprising generating a STEM image based on the detected emissions resultant from the STEM beam and the TEM beam being incident on the sample.

L8. The method of any of paragraphs L1-L7, further comprising generating a TEM image based on the detected emissions resultant from the STEM beam and the TEM beam being incident on the sample.

L9. The method of any of paragraphs L1-L8, wherein the emissions resultant from the STEM beam and the TEM beam being incident on the sample are detected with a single detector and/or detector array.

L9.1. The method of any of paragraphs L1-L8, wherein the emissions resultant from the STEM beam are detected with a first detector and/or detector array and the TEM beam being incident on the sample are detected with a second detector and/or detector array.

L9.1.1. The method of paragraphs L9.1, wherein the first detector and/or detector array is positioned in a different plane than the second detector and/or detector array.

L9.1.1. The method of paragraphs L9.1, wherein method further comprises mechanically switching the first detector and/or detector array and/or the second detector and/or detector array.

L10. The method of any of paragraphs L1-L9, wherein the forming of the plurality of electrons particles into a first electron beam and a second electron beam and the modification of the focal properties is performed at least in part by a bifocal beamformer.

L10.1. The method of paragraph L10, wherein the bifocal beamformer is a MEMS device of any of paragraphs F1-F12.1.

L10.2. The method of paragraph L10, wherein the bifocal beamformer is a multi aperture array of any of paragraphs I1-I13.4.4.

L10.2. The method of any of paragraphs L10-L10.2, wherein the bifocal beamformer applies at least a quadrupole lensing effect to one of the first electron beam and the second electron beam.

M1. A method for bifocal multibeam sample processing, the method comprising: emitting a plurality of electrons toward a sample; splitting the plurality of electrons into a first electron beam and a second electron beam; modifying the focal properties of at least one of the first electron beam and the second electron beam; processing a region of the sample with the first electron beam to induce a physical change to the sample; and imaging the region of the sample with the second electron beam during the processing.

M2. The method of paragraph M1, wherein the processing and the imaging is performed at the same time.

M3. The method of any of paragraphs M1-M2, wherein processing the region of the sample comprises focusing the first electron beam onto a plane at or near the surface of sample.

M3.1. The method of paragraph M3, wherein the processing further comprises introducing a gas to a volume proximate the region of interest.

M3.2. The method of any of paragraphs M3-M3.1, wherein the processing further comprises causing radiation damage to the surface of the sample.

M3.3. The method of any of paragraphs M3-M3.2, wherein the processing further comprises causing a phase change to an irradiated region of the sample.

M3.4. The method of any of paragraphs M3-M3.3, wherein the processing further comprises electron beam induced etching.

M3.4.1. The method of paragraph M3.4, wherein the processing further comprises performing gas assisted etching with the first electron beam.

M3.5. The method of any of paragraphs M3-M4.1, wherein the processing further comprises electron beam induced deposition.

M3.5.1. The method of paragraph M3.5, wherein, wherein the processing further comprises performing gas assisted deposition with the first electron beam.

M3.5.2. The method of any of paragraphs M3.5-M3.5.1, wherein the performing electron beam induced deposition comprises building a needle structure on the sample.

M3.6. The method of any of paragraphs M3-M3.5.2, wherein the processing comprises reducing a charging and/or biasing effect on the region of interest of the sample.

M4. The method of any of paragraphs M1-M3.5.3, wherein the imaging the region of the sample comprises focusing the second beam such that it is incident on the region of interest.

M4.1. The method of paragraph M4, wherein imaging the region of the sample comprises performing TEM imaging with the second electron beam.

M4.2. The method of paragraph M4, wherein imaging the region of the sample comprises performing STEM imaging with the second electron beam.

M4.3. The method of any of paragraphs M4-M4.2, wherein the second beam is a parallel beam at the plane at or bear the surface of the sample.

M4.4. The method of any of paragraphs M4-M4.3, wherein imaging the region of the sample comprises: detecting, with a detector located downstream of the sample, the second electron beam and/or electrons emitted as a result of the second beam being incident on the sample; and generating one or more images of the region of interest based on the detected second electron beam and/or electrons emitted as a result of the second beam being incident on the sample.

M4.4.1. The method of paragraphs M4.4, wherein the detector does not detect the first electron beam.

M4.4.1.1. The method of paragraph M4.4.1, wherein the tilt angle of the first electron beam at the sample is such that the second electron beam is not incident on the detector.

M4.3.1.2. The method of any of paragraphs M4.4.1-M4.4.1.1, wherein the second electron beam is blocked such that it does not strike the sample.

M4.3.1.2.1. The method of paragraphs M4.3.1.2, wherein the second electron beam is blocked by an objective lens aperture.

M5. The method of any of paragraphs M1-M4.3.1.2, wherein modifying the focal properties of at least one of the first electron beam and the second electron beam comprises applying at least a quadrupole lensing effect to at least one of the beams.

M5.1. The method of paragraphs M5, wherein the at least a quadrupole lensing effect is applied by a bifocal beamformer.

M5.2. The method of paragraph M5.1., wherein the bifocal beamformer is a MEMS device of any of paragraphs F1-F12.1.

M5.3. The method of paragraph M5.1., wherein the bifocal beamformer is a multi-aperture device of any of paragraphs I1-I13.4.4.

M6. The method of any of paragraphs M1-M5.3, further comprising deflecting the first electron beam to perform a processing of a different region of the sample.

M6.1. The method of paragraph M6, wherein the deflection of the first electron beam is performed by the bifocal beamformer.

M6.2. The method of any of paragraphs M6-6.1, wherein the deflection of the first electron beam is performed by the multipole element.

M7. The method of any of paragraphs M1-6.2, wherein splitting the plurality of electrons into a first electron beam and a second electron beam comprises splitting the plurality of electrons into an axial first electron beam and a non-axial second electron beam.

M8. The method of any of paragraphs M1-6.2, wherein splitting the plurality of electrons into a first electron beam and a second electron beam comprises splitting the plurality of electrons into a non-axial first electron beam and an axial second electron beam.

M9. The method of any of paragraphs M1-M8, changing the characteristics of the STEM beam based on the imaging the region of the sample with the second electron beam.

M9.1. The method of paragraph M9, wherein changing the characteristics of the STEM beam includes changing one or more of: the location of incidence of the first electron beam on the region of interest; the spot size of the of first electron beam on the region of interest; the current of the first electron beam.

What is claimed is:

1. A method for bifocal multibeam sample processing, the method comprising:
    emitting a plurality of electrons toward a sample; splitting the plurality of electrons into a first electron beam and a second electron beam;
    modifying the focal properties of at least one of the first electron beam and the second electron beam;
    processing a region of the sample with the first electron beam to induce a physical change to the sample; and
    imaging the region of the sample with the second electron beam during the processing.

2. The method of claim 1, wherein the processing and the imaging is performed at the same time.

3. The method of claim 1, wherein processing the region of the sample comprises focusing the first electron beam onto a plane at or near a surface of sample.

4. The method of 1, wherein the processing further comprises at least one of:
- introducing a gas to a volume proximate the region of the sample;
- causing radiation damage to the sample;
- causing a phase change to an irradiated region of the sample;
- electron beam induced etching;
- gas assisted etching with the first electron beam;
- releasing the tension of a cryo sample; and
- electron beam induced deposition.

5. The method of claim 1, wherein the processing comprises reducing a charging and/or biasing effect on the region of the sample.

6. The method of claim 1, wherein the imaging the region of the sample comprises performing TEM imaging with the second electron beam.

7. The method of claim 1, further comprising using a fast blanker to block the first beam, and reimaging the region of the sample with the second electron beam while the first beam is blocked.

8. The method of claim 1, wherein the second beam is a parallel or a near parallel beam at a plane at the sample.

9. The method of claim 1, wherein imaging the region of the sample comprises:
- detecting, with a detector located downstream of the sample, the second electron beam and/or electrons scattered as a result of the second beam being incident on the sample; and
- generating one or more images of the region of the sample based on the detected second electron beam and/or electrons scattered as a result of the second beam being incident on the sample.

10. The method of claim 9, wherein a tilt angle of the first electron beam at the sample is such that the first electron beam is not incident on the detector.

11. The method of claim 9, wherein at least an unscattered portion of the first electron beam is blocked such that it does not strike the detector.

12. The method of claim 9, wherein the first electron beam is blocked by an objective lens aperture.

13. The method of claim 1, wherein modifying the focal properties of at least one of the first electron beam and the second electron beam comprises applying at least a quadrupole lensing effect to at least one of the beams.

14. The method of claim 13, wherein the at least a quadrupole lensing effect is applied by one of a MEMS device and a multi-aperture device.

15. The method of claim 1, further comprising deflecting the first electron beam to perform a processing of a different region of the sample.

16. The method of claim 1, wherein splitting the plurality of electrons into the first electron beam and the second electron beam comprises splitting the plurality of electrons into an axial first electron beam and a non-axial second electron beam.

17. The method of claim 1, wherein splitting the plurality of electrons into the first electron beam and the second electron beam comprises splitting the plurality of electrons into a non-axial first electron beam and an axial second electron beam.

18. The method of claim 1, changing characteristics of the first electron beam based on the imaging the region of the sample with the second electron beam.

19. The method of claim 18, wherein changing the characteristics of the first electron beam includes changing one or more of:
- a location of incidence of the first electron beam on the region of the sample;
- a probe size of the of first electron beam on the region of the sample; and
- a current of the first electron beam.

* * * * *